US008411252B2

(12) United States Patent
Jacobs et al.

(10) Patent No.: US 8,411,252 B2
(45) Date of Patent: Apr. 2, 2013

(54) LITHOGRAPHIC APPARATUS AND DEVICE MANUFACTURING METHOD UTILIZING A SUBSTRATE HANDLER

(75) Inventors: Hernes Jacobs, Eindhoven (NL); Bernardus Antonius Johannes Luttikhuis, Nuenen (NL); Harmen Klaas Van Der Schoot, Vught (NL); Petrus Matthijs Henricus Vosters, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 415 days.

(21) Appl. No.: 12/639,457

(22) Filed: Dec. 16, 2009

(65) Prior Publication Data

US 2010/0085553 A1    Apr. 8, 2010

Related U.S. Application Data

(60) Division of application No. 11/320,494, filed on Dec. 29, 2005, now Pat. No. 7,656,506, which is a continuation-in-part of application No. 11/157,201, filed on Jun. 21, 2005, now Pat. No. 7,538,857, which is a continuation-in-part of application No. 11/067,671, filed on Mar. 1, 2005, now Pat. No. 7,242,458.

(60) Provisional application No. 60/639,960, filed on Dec. 30, 2004, provisional application No. 60/638,171, filed on Dec. 23, 2004.

(51) Int. Cl.
*G03B 27/58* (2006.01)
*G03B 27/52* (2006.01)

(52) U.S. Cl. .......................................... 355/72; 355/30

(58) Field of Classification Search ................... 355/30, 355/72–76; 378/34, 35
See application file for complete search history.

(56) References Cited

U.S. PATENT DOCUMENTS

| 5,063,582 | A | * | 11/1991 | Mori et al. ...................... 378/34 |
| 5,229,872 | A |   | 7/1993  | Mumola |
| 5,296,891 | A |   | 3/1994  | Vogt et al. |
| 5,329,126 | A | * | 7/1994  | Amemiya et al. ....... 250/453.11 |
| 5,500,736 | A |   | 3/1996  | Koitabashi et al. |
| 5,523,193 | A |   | 6/1996  | Nelson |
| 5,530,482 | A |   | 6/1996  | Gove et al. |
| 5,579,147 | A |   | 11/1996 | Mori et al. |
| 5,677,703 | A |   | 10/1997 | Bhuva et al. |
| 5,808,797 | A |   | 9/1998  | Bloom et al. |
| 5,982,553 | A |   | 11/1999 | Bloom et al. |
| 6,133,986 | A |   | 10/2000 | Johnson |
| 6,177,980 | B1 |  | 1/2001  | Johnson |
| 6,552,773 | B2 | * | 4/2003 | Emoto .......................... 355/53 |
| 6,559,928 | B1 |  | 5/2003  | Aoki |
| 6,606,145 | B2 |  | 8/2003  | Irie et al. |

(Continued)

FOREIGN PATENT DOCUMENTS

| JP | 04-030522 A  | 2/1992 |
| JP | 4-63643 U    | 5/1992 |

(Continued)

OTHER PUBLICATIONS

English-Language Abstract for Japanese Patent Publication No. 04-372385 A, published Dec. 25, 1992; 1 page.

(Continued)

*Primary Examiner* — Hung Henry Nguyen
(74) *Attorney, Agent, or Firm* — Sterne, Kessler, Goldstein & Fox P.L.L.C

(57) ABSTRACT

A substrate handler is provided. The substrate handler includes a support surface configured to carry a substrate and a pre-conditioning unit configured to pre-condition the substrate. The substrate handler is configured to move the substrate relative to a substrate table.

5 Claims, 21 Drawing Sheets

U.S. PATENT DOCUMENTS

| | | | |
|---|---|---|---|
| 6,687,041 | B1 | 2/2004 | Sandstrom |
| 6,698,944 | B2 | 3/2004 | Fujita |
| 6,747,783 | B1 | 6/2004 | Sandstrom |
| 6,781,669 | B2 | 8/2004 | Tanaka |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 6,879,866 | B2 | 4/2005 | Tel et al. |
| 7,070,661 | B2 * | 7/2006 | Eiriksson et al. ............. 118/725 |
| 7,242,458 | B2 | 7/2007 | Munnig Schmidt |
| 7,260,448 | B2 | 8/2007 | Goto et al. |
| 7,359,031 | B2 | 4/2008 | Klomp et al. |
| 7,538,857 | B2 | 5/2009 | Jacobs et al. |
| 7,656,506 | B2 | 2/2010 | Jacobs et al. |
| 7,746,447 | B2 * | 6/2010 | Zaal et al. ....................... 355/53 |
| 2004/0041104 | A1 | 3/2004 | Liebregts et al. |
| 2004/0130561 | A1 | 7/2004 | Jain |
| 2005/0007572 | A1 | 1/2005 | George et al. |
| 2006/0092399 | A1 | 5/2006 | Ockwell |
| 2006/0139616 | A1 | 6/2006 | Jacobs et al. |
| 2006/0158634 | A1 | 7/2006 | Jacobs et al. |
| 2006/0252270 | A1 | 11/2006 | Jacobs |
| 2007/0008512 | A1 | 1/2007 | Van Der Schoot et al. |

FOREIGN PATENT DOCUMENTS

| | | |
|---|---|---|
| JP | 04-372385 A | 12/1992 |
| JP | 6-80242 A | 3/1994 |
| JP | 06-252246 A | 9/1994 |
| JP | 11-130255 A | 5/1999 |
| JP | 11-238672 A | 8/1999 |
| JP | 2000-072251 A | 3/2000 |
| JP | 2002-181714 A | 6/2002 |
| JP | 2002-231781 A | 8/2002 |
| JP | 2004-247548 A | 9/2004 |
| JP | 2004-343068 A | 12/2004 |
| WO | WO 98/33096 A2 | 7/1998 |
| WO | WO 98/33096 A3 | 7/1998 |
| WO | WO 98/38597 A1 | 9/1998 |

OTHER PUBLICATIONS

English-Language Abstract for Japanese Patent Publication No. 2000-072251 A, published Mar. 7, 2000; 1 page.

English-Language Abstract for Japanese Patent Publication No. 2002-181714 A, published Jun. 26, 2002; 1 page.

English-Language Abstract for Japanese Patent Publication No. 2002-231781 A, published Aug. 16, 2002; 1 page.

English-Language Abstract for Japanese Patent Publication No. 2004-343068 A, published Dec. 2, 2004; 1 page.

English Language Translation of Notification of Reason(s) for Refusal directed to related Japanese Patent Application No. 2009-146006, mailed Sep. 6, 2011, from the Japanese Patent Office; 2 pages.

English Translation of Notification of Reason for Refusal for Japanese Patent Application No. 2005-377858, mailed Dec. 24, 2008, 3 pgs.

Non-Final Rejection mailed Oct. 30, 2006 for U.S. Appl. No. 11/067,671, filed Mar. 1, 2005, 9 pgs.

Notice of Allowance mailed Feb. 14, 2007 for U.S. Appl. No. 11/067,671, filed Mar. 1, 2005, 6 pgs.

Notice of Allowance mailed Apr. 27, 2007 for U.S. Appl. No. 11/067,671, filed Mar. 1, 2005, 3 pgs.

Notice of Allowance mailed Oct. 21, 2008 for U.S. Appl. No. 11/157,201, filed Jun. 21, 2005, 6 pgs.

Non-Final Rejection mailed Nov. 8, 2007 for U.S. Appl. No. 11/157,201, filed Jun. 21, 2005, 11 pgs.

Final Rejection mailed May 14, 2008 for U.S. Appl. No. 11/157,201, filed Jun. 21, 2005, 12 pgs.

Notice of Allowance mailed Jul. 7, 2008 for U.S. Appl. No. 11/157,201, filed Jun. 21, 2005, 4 pgs.

Non-Final Rejection mailed Jan. 16, 2009 for U.S. Appl. No. 11/320,494, filed Dec. 29, 2005, 11 pgs.

Final Rejection mailed Jun. 30, 2009 for U.S. Appl. No. 11/320,494, filed Dec. 29, 2005, 11 pgs.

Notice of Allowance mailed Sep. 17, 2009 for U.S. Appl. No. 11/320,494, filed Dec. 29, 2005, 4 pgs.

English Translation of Notification of Reason(s) for Refusal for Japanese Patent application No. 2005-377858, mailed Mar. 16, 2010, 4 pgs.

English Language Abstract of Japanese Publication No. 04-030552 A, published Feb. 3, 1992; 1 page.

English Language Abstract of Japanese Publication No. 06-252246 A, published Sep. 9, 1994; 1 page.

English translation of Japanese Notification of Reasons for Refusal directed to related Japanese Patent Application No. 2005-377858, Japanese Patent Office, mailed Mar. 15, 2011; 3 pages.

English-Language Abstract for Japanese Patent Publication No. 2004-247548 A, published Sep. 2, 2004, Japanese Patent Office; 1 page.

English-Language Translations of Notice of Reason(s) for Refusal directed to related Japanese Patent Application No. 2009-146010, mailed Aug. 2, 2011, Japanese Patent Office; 2 pages.

Notice of Allowance mailed Sep. 8, 2008 for U.S. Appl. No. 11/157,201, filed Jun. 21, 2005; 7 pages.

Notice of Allowance mailed Feb. 6, 2009 for U.S. Appl. No. 11/157,201, filed Jun. 21, 2005; 6 pages.

Notice of Allowance mailed Apr. 13, 2009 for U.S. Appl. No. 11/157,201, filed Jun. 21, 2005; 6 pages.

* cited by examiner

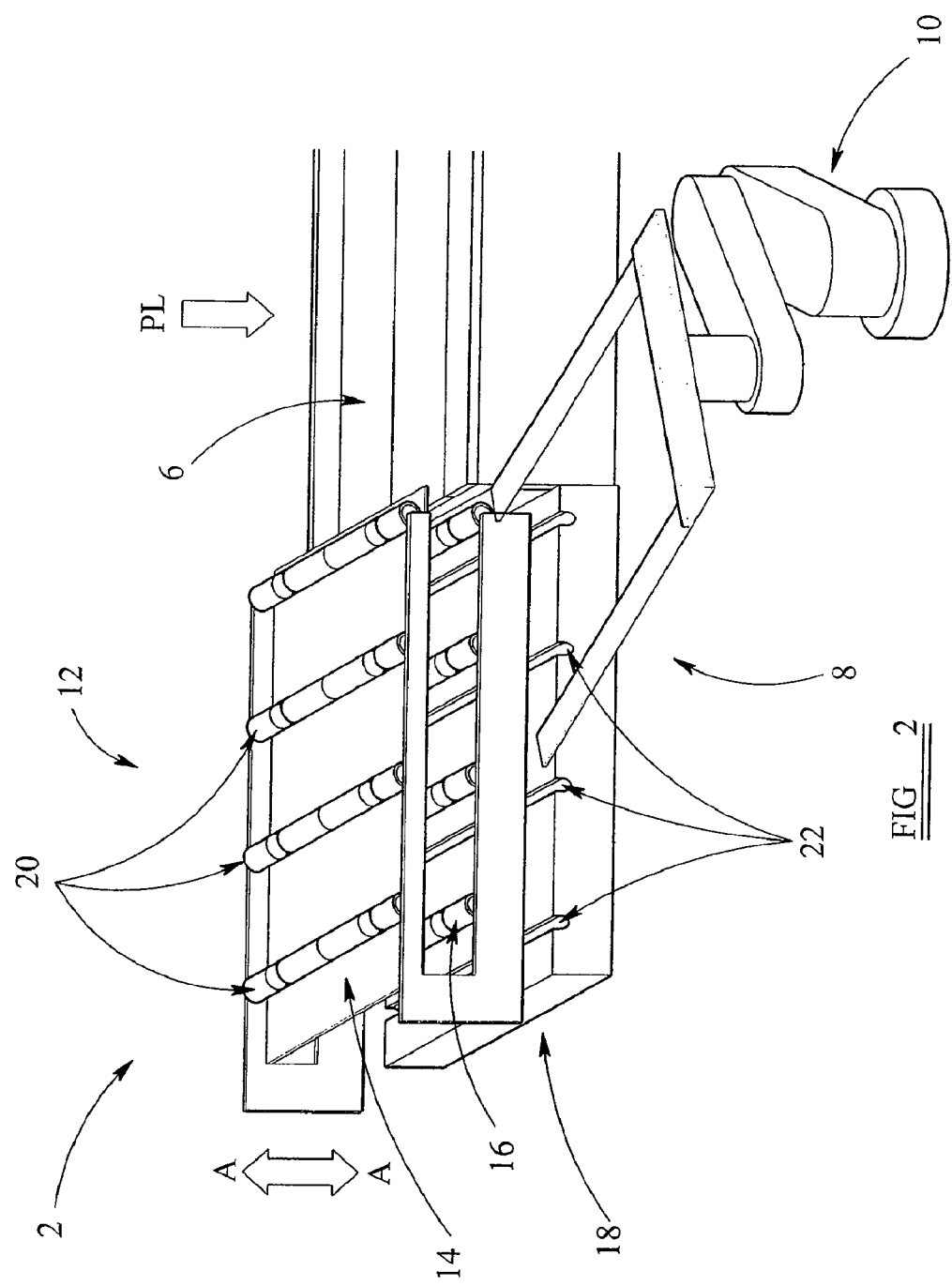

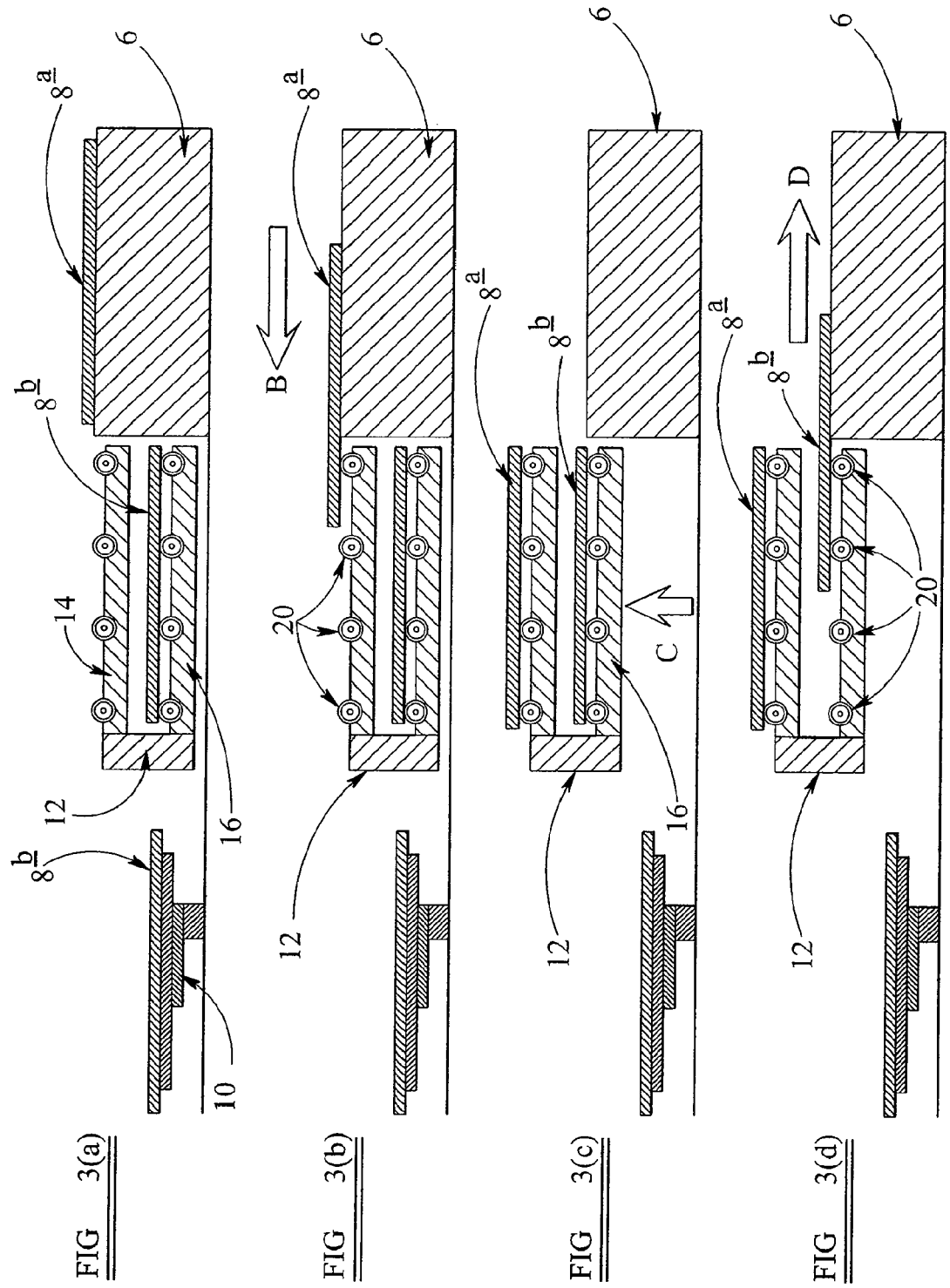

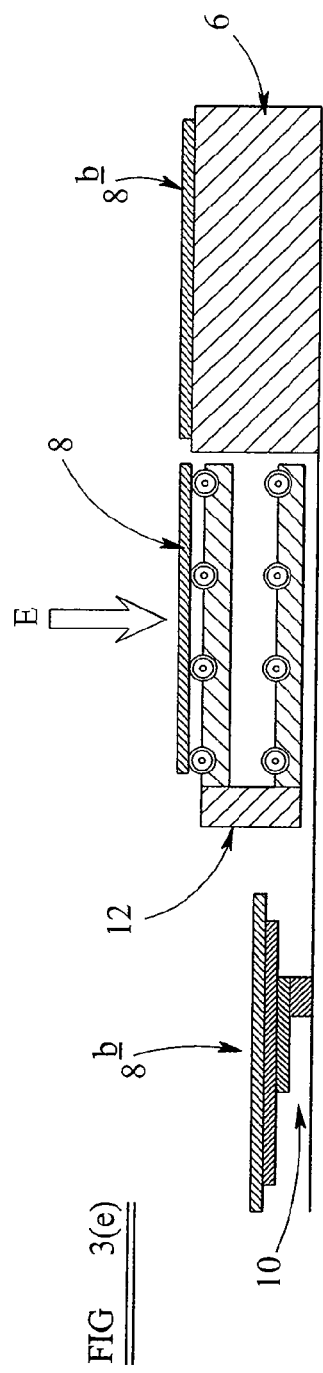
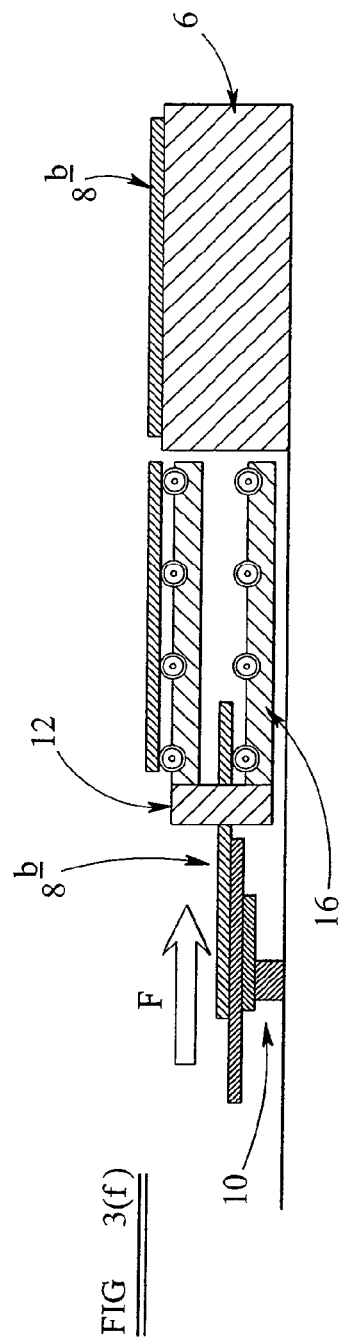
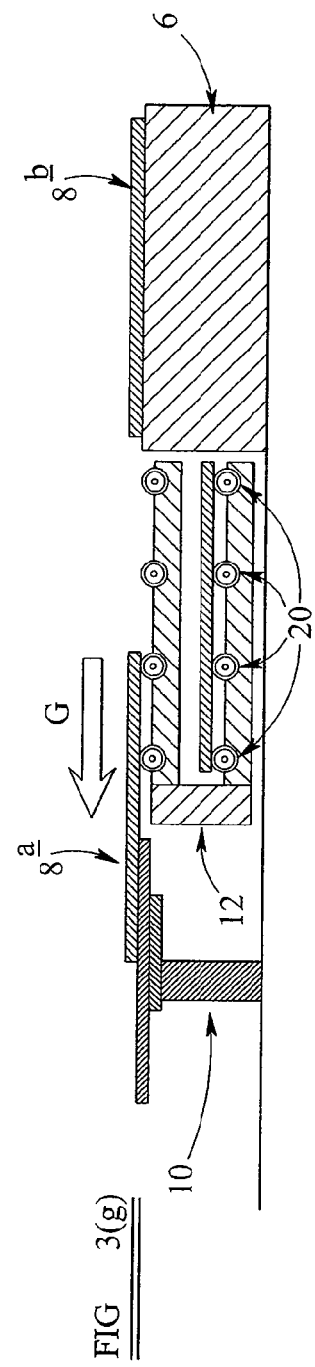
FIG 3(e)
FIG 3(f)
FIG 3(g)

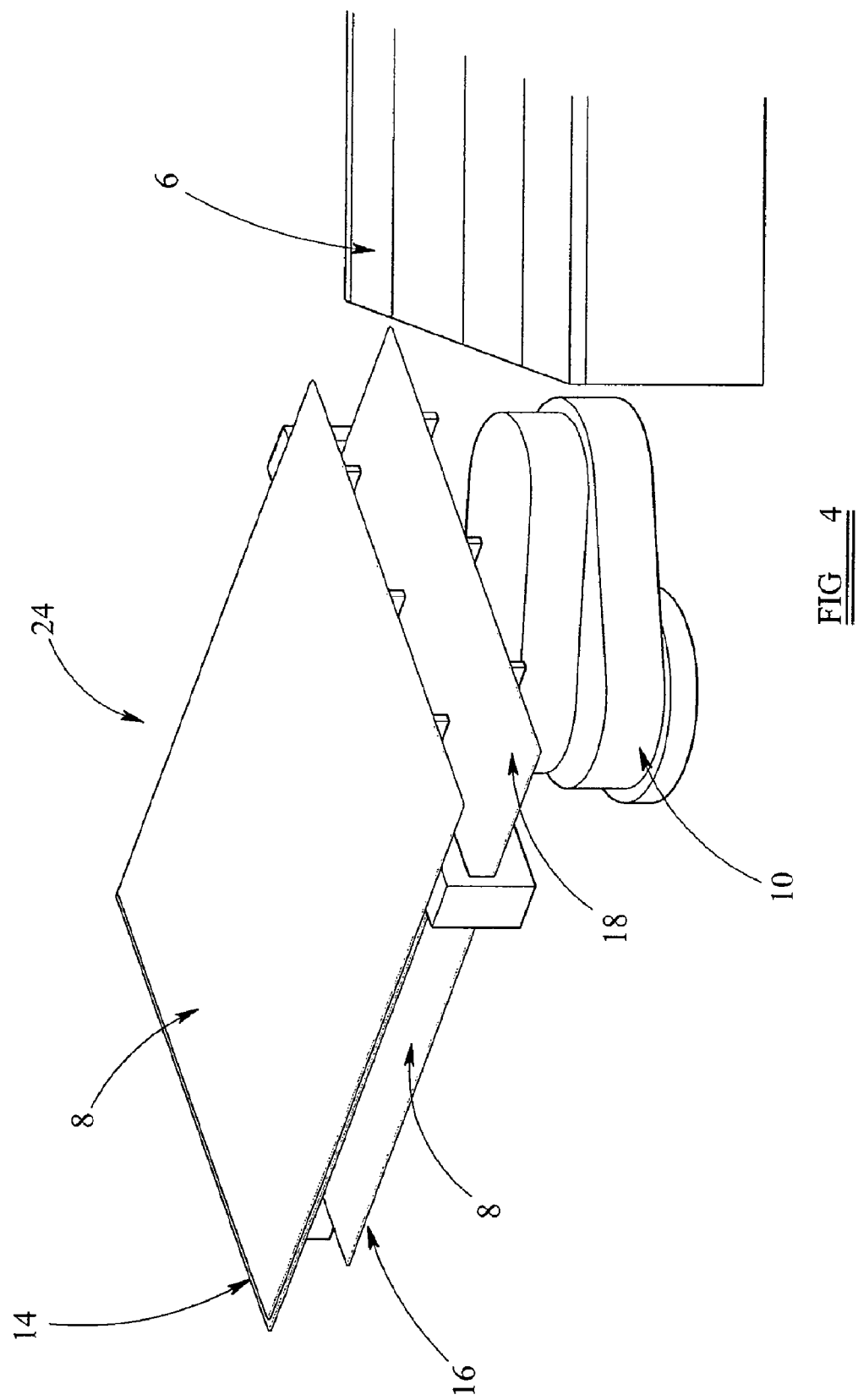

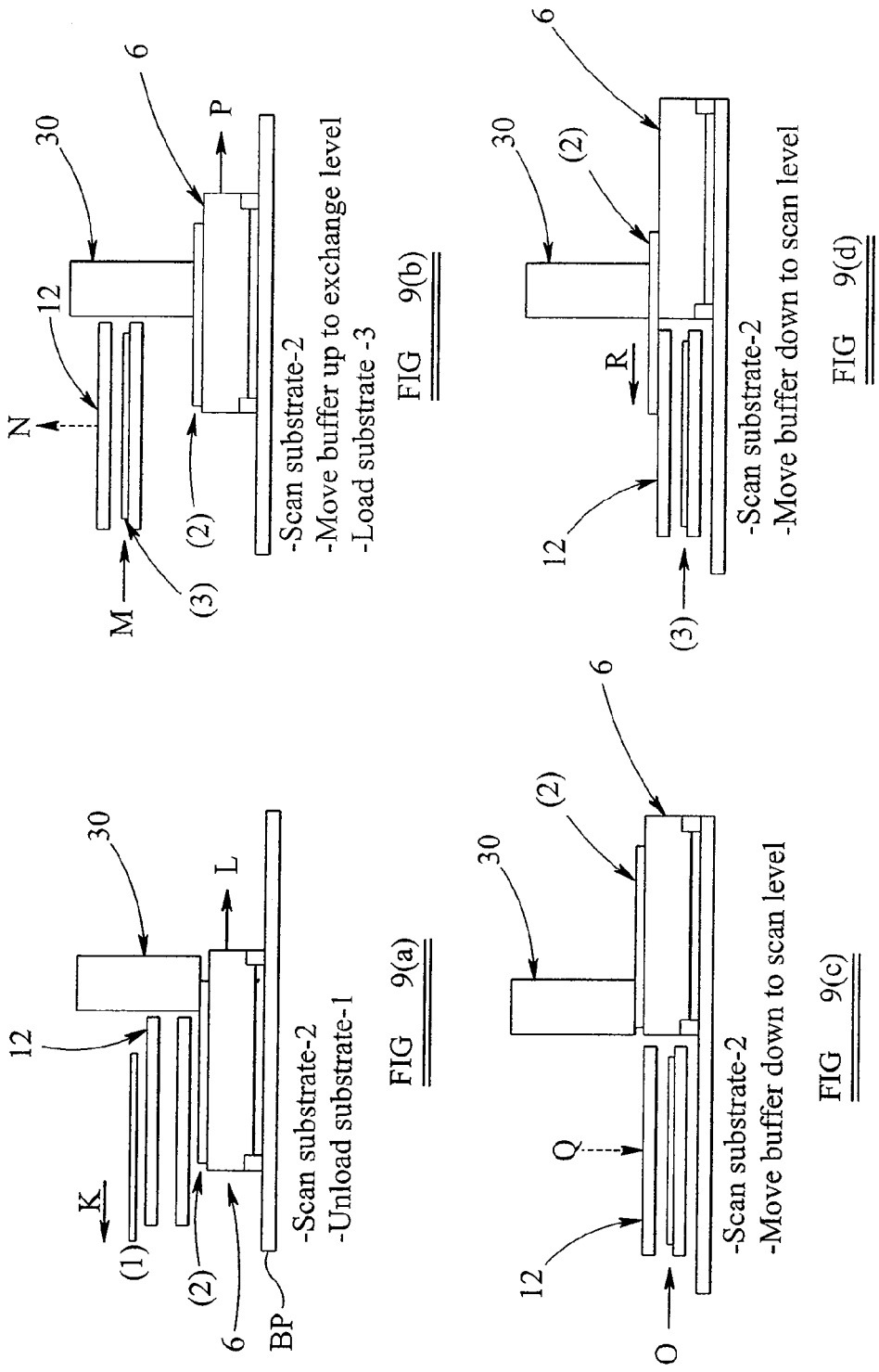

"FRONT IN FRONT OUT" LOADING SEQUENCE

- Move buffer up in Z-dir
- Transport substrate-3 to chuck

- Move buffer up for scan clearance chuck

- Move chuck to start point scan position

- Transport substrate-2 to buffer

SUBSTRATE MATERIAL FLOW

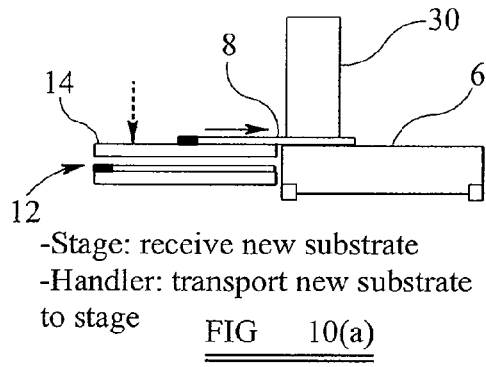

-Stage: receive new substrate
-Handler: transport new substrate
to stage

FIG 10(a)

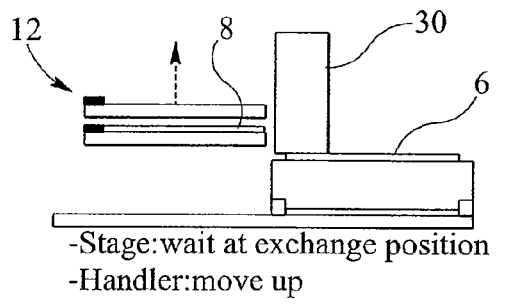

-Stage: wait at exchange position
-Handler: move up

FIG 10(b)

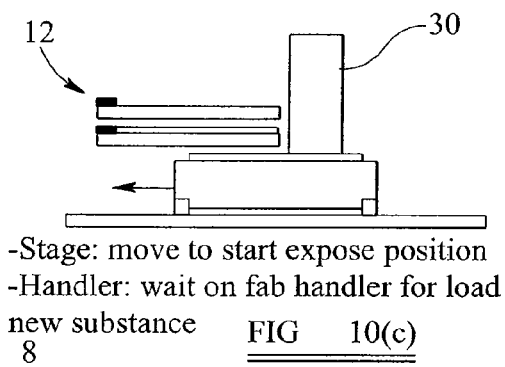

-Stage: move to start expose position
-Handler: wait on fab handler for load
new substance

FIG 10(c)

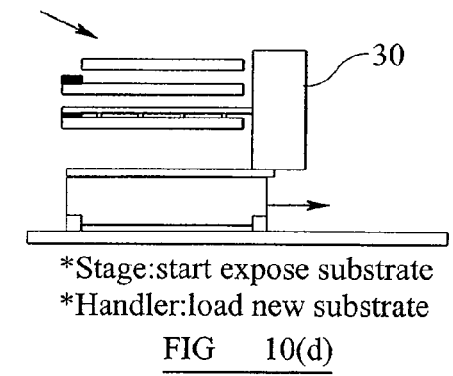

*Stage: start expose substrate
*Handler: load new substrate

FIG 10(d)

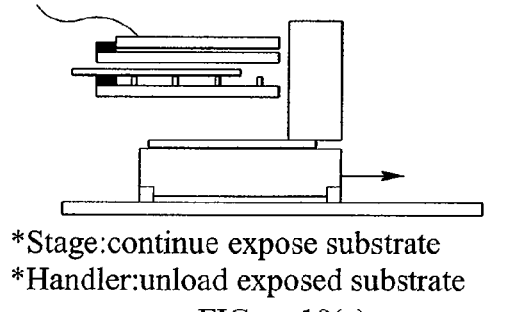

*Stage: continue expose substrate
*Handler: unload exposed substrate

FIG 10(e)

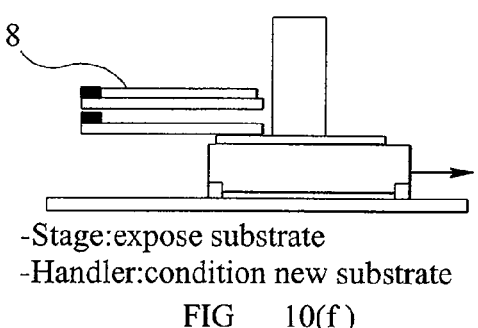

-Stage: expose substrate
-Handler: condition new substrate

FIG 10(f)

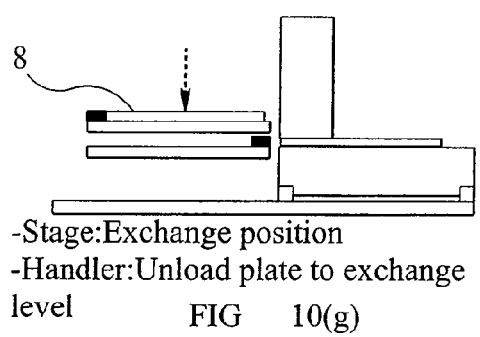

-Stage: Exchange position
-Handler: Unload plate to exchange
level

FIG 10(g)

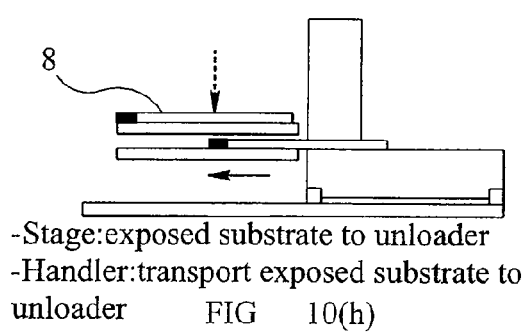

-Stage: exposed substrate to unloader
-Handler: transport exposed substrate to
unloader

FIG 10(h)

"FRONT IN, REAR OUT CONCEPT" LOADING SEQUENCE

- Scan substrate
- Load new substrate in pre-conditioner

- Scan ready
- Move "unload stage/plate" down

- Move scanned substrate on "unload stage/plate"

- Move "unload stage/plate" up to fab-exchange level
- Move chuck in +Y

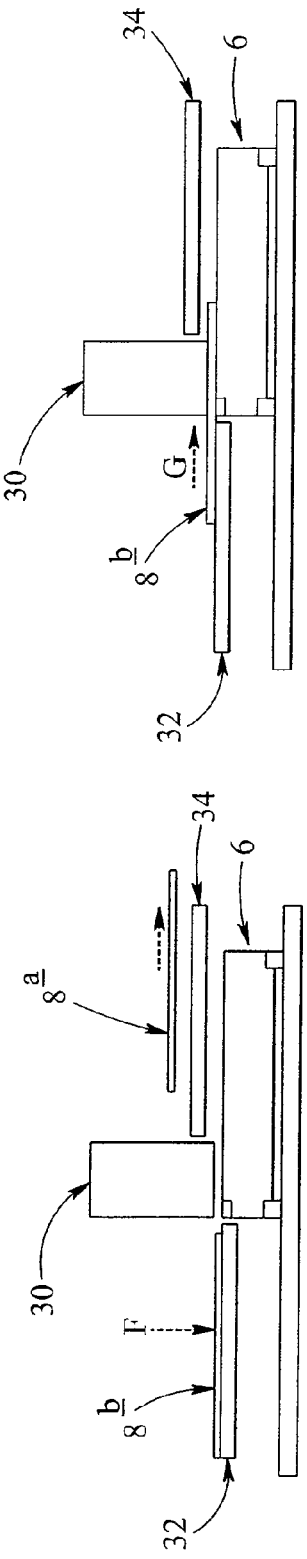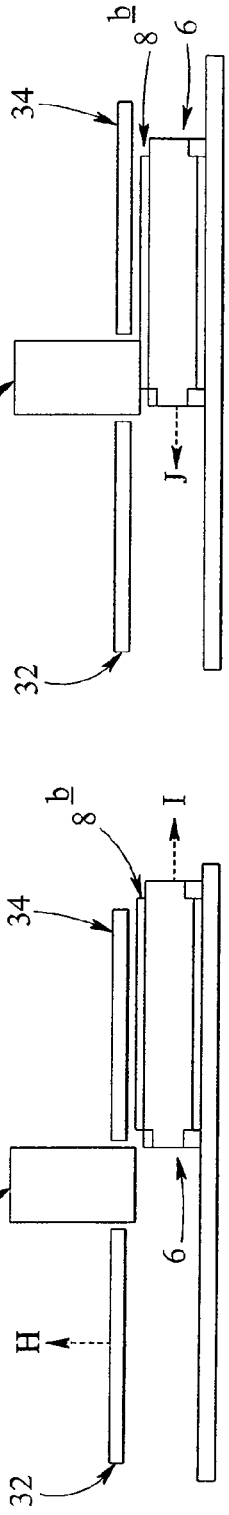

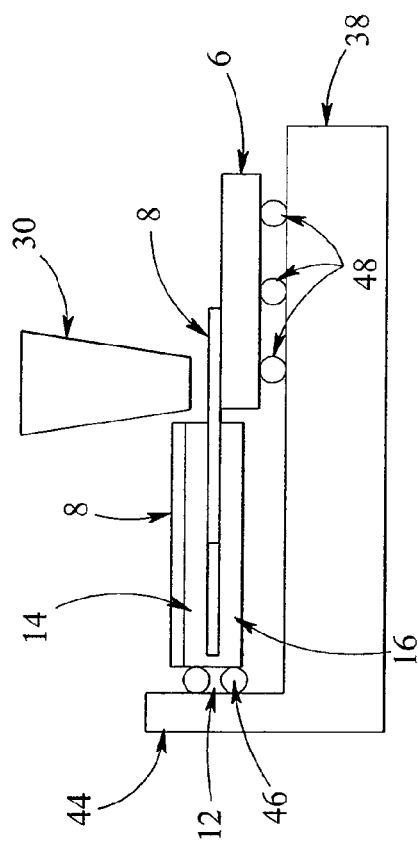
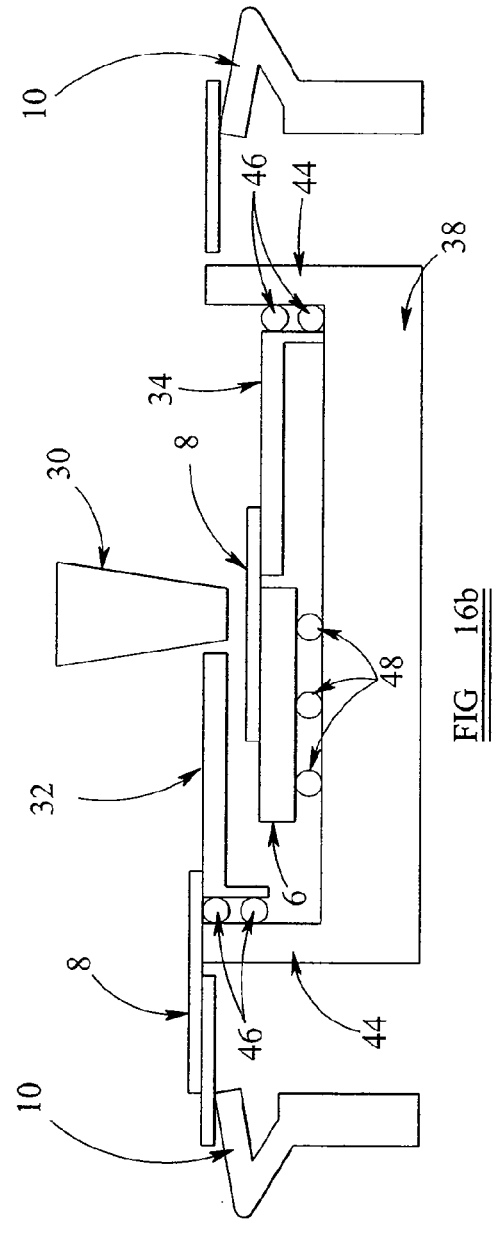

LITHOGRAPHIC APPARATUS AND DEVICE MANUFACTURING METHOD UTILIZING A SUBSTRATE HANDLER

CROSS REFERENCE TO RELATED APPLICATIONS

This application is a divisional of U.S. application Ser. No. 11/320,494, filed Dec. 29, 2005 (now U.S. Pat. No. 7,656,506), which is a continuation-in-part of U.S. application Ser. No. 11/157,201, filed Jun. 21, 2005, (now U.S. Pat. No. 7,538,857), which claims benefit under 35 U.S.C. §119(e) to U.S. Provisional Application No. 60/639,960, filed Dec. 30, 2004, which are all incorporated by reference herein in their entireties.

U.S. application Ser. No. 11/157,201 is also a continuation-in-part of U.S. application Ser. No. 11/067,671, filed Mar. 1, 2005, (now U.S. Pat. No. 7,242,458), which claimed benefit under 35 U.S.C. §119(e) to U.S. Provisional Patent Application No. 60/638,171, filed Dec. 23, 2004, which are all incorporated herein by reference in their entireties.

BACKGROUND

1. Field of the Present Invention

The present invention relates to a substrate handler and methods of using same. The present invention extends to device manufacturing methods using a lithographic apparatus which in part comprises the substrate handler.

2. Related Art

A lithographic apparatus is a machine that applies a desired pattern onto a target portion of a substrate. Lithographic apparatus can be used, for example, in the manufacture of integrated circuits (ICs), flat panel displays (FPDs) and other devices involving fine structures. In a embodiment of the present invention lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (resist). Instead of a mask, the patterning means can comprise an array of individually controllable elements, which serve to generate the circuit pattern.

In general, a single substrate will contain a network of adjacent target portions that are successively exposed. The substrate is secured on a substrate exposure table or stage, during a scanning process. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Substrates that are to be irradiated on the substrate exposure table are stored in a substrate storage area or track, and are then moved by a robot or a conveyor to a substrate handler. The substrate handler is adjacent the substrate exposure stage and is used to transfer a substrate directly to and from the exposure table. Known substrate handlers are capable of handling only one substrate at the same time. However, such substrate handlers that are capable of handling only one substrate at any one time have the disadvantage of only being able to pick up and/or put away substrates, i.e., the substrate handler can put an exposed substrate away before it can pick up and load an unexposed substrate. During these handling movements, the parts of the lithographic apparatus involved with irradiating substrates, are sitting idle. In addition, the time necessary for these movements by the substrate handler depends on the layout of the lithographic apparatus, and the demands of the user, and so is difficult to control. Hence, a major problem with known substrate handlers is that the throughput of a single stage machine (such as FPD machines) suffers on account of the delays associated with the handling time of the substrates.

A further problem associated with known lithographic apparatus is that the handling stage of the apparatus consisting of the substrate handler is located next to the exposure table. This gives the apparatus a "footprint" penalty, i.e., the total floor area occupied by the apparatus is large. A problem with having a large footprint is that the apparatus can be contained within a large frame structure that requires many cover plates, and requires a complicated network of wiring. This results in high manufacturing costs, which in turn increases the cost of the final product. In addition, the total weight of the apparatus is high, and is therefore difficult to move about.

Therefore, what is needed is an apparatus and method using a substrate handler which can function more efficiently. What is also needed is a method of manipulating substrates in a lithographic apparatus.

SUMMARY

According to a first embodiment of the present invention, there is provided substrate handler. The substrate handler includes a support surface configured to carry a substrate and a pre-conditioning unit configured to pre-condition the substrate. The substrate handler is configured to move the substrate relative to a substrate table.

Table 1 below shows a comparison of the handling sequence of a conventional single substrate handler, and a substrate handler according to the present invention, i.e., one adapted to carry a plurality of substrates simultaneously.

TABLE 1

| A single substrate handler | A double substrate handler |
|---|---|
| 1. Pick up exposed substrate from substrate table | 1. Pick up exposed substrate from substrate table |
| 2. Move exposed substrate to take-over stage, where it is stored | 2. Move handler |
| 3. Put exposed substrate on take-over stage | 3. Put unexposed substrate on substrate table |
| 4. Move to pick-up table where unexposed substrates are stored | |
| 5. Pick up an unexposed substrate | |
| 6. Move to substrate table | |
| 7. Put unexposed substrate on substrate table | |

Hence, the throughput using the lithographic apparatus according to the present invention increases because of the fast substrate-swapping time on and off the substrate table, which is made possible by the substrate handler. The substrate handler can be adapted to move in the vertical direction relative to the exposure table. The length of travel in the vertical direction is significantly less than the horizontal travel distance of conventional handlers and so further throughput improvements are achieved.

In another embodiment, a lithographic apparatus is provided. The lithographic apparatus includes a base plate, a substrate table configured to support a substrate, a patterning system configured to provide a pattern to a target portion of the substrate, and a substrate handler configured to move the substrate relative to the substrate table. The substrate handler is positioned substantially over the base plate. The base plate is configured to support the substrate table.

In still another embodiment, a method is provided. The method includes moving a substrate handler so that a first support surface is substantially aligned in a horizontal plane with a substrate table, loading a substrate directly from the first support surface of the substrate handler onto the substrate table, patterning a substrate using the patterning system, unloading the exposed substrate from the substrate table onto a second support surface of the substrate handler, and removing the exposed substrate from the second support surface of the substrate handler.

In another embodiment, a method is provided. The method includes receiving a substrate on a substrate table supported by a base plate, patterning a target portion of the substrate, and moving the substrate relative to the substrate table using a substrate handler. The substrate handler is positioned substantially over the base plate.

In another embodiment, a lithographic apparatus is provided. The lithographic apparatus includes a substrate table configured to support a substrate, a patterning system configured to provide a pattern to a target portion of the substrate, and a substrate handler configured to move the substrate relative to the substrate table. The substrate table is supported on a base plate and traveling therealong during a scanning operation between a start position and an end position. The substrate handler includes a loading platform disposed on one side of the substrate table above the base plate, and an unloading platform disposed on an opposite side of the substrate table and to one side of the base plate, at least the loading platform being vertically movable between a raised position above the substrate table and a lowered position in which the unloading platform is substantially aligned in a horizontal plane with the substrate table. The loading platform is configured to load the substrate onto the table if the loading platform is in the lowered position, and to receive the substrate from the substrate table if the loading platform is at an end position after the scanning operation. Both the loading and the unloading platform are substantially level with the substrate table when the substrate table is at the end position so that loading and unloading is configured to be performed substantially simultaneously.

In another embodiment, a substrate handler is provided. The substrate handler includes a substrate table configured to support a substrate during exposure to a beam of radiation and a plurality of platforms. Each platform is configured to carry the substrate. The substrate handler is configured to load the substrate onto the substrate table before exposure and to unload the substrate from the substrate table after exposure.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 2 shows an enlarged perspective view of a first embodiment of the present invention showing a substrate handler, substrate exposure stage, and robot.

FIG. 3a-g shows a schematic side view representation of the sequence of loading and unloading a substrate on to the substrate exposure stage using one embodiment of the present invention.

Figure 5:
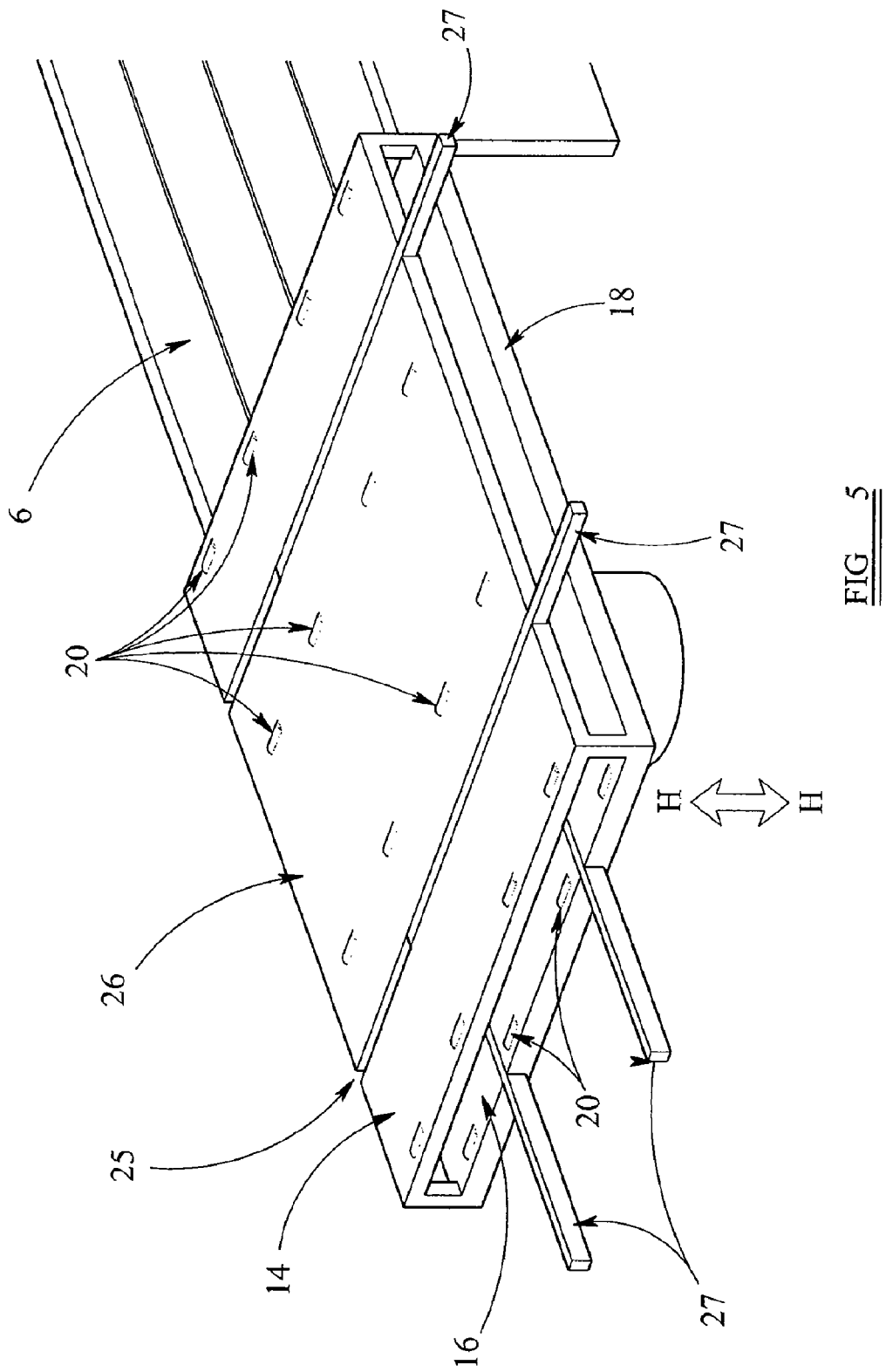
Figure 6:
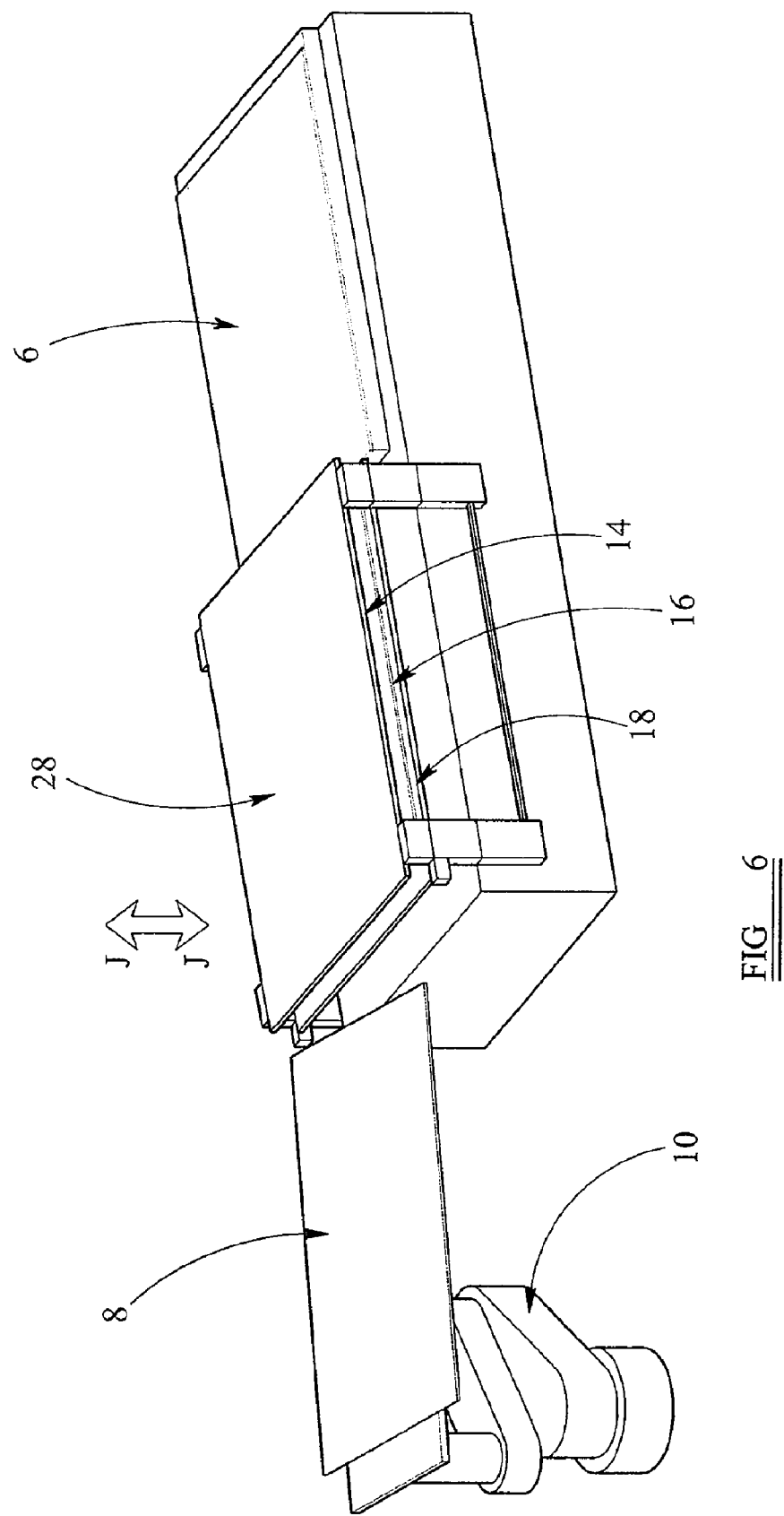

FIGS. 4, 5, and 6 show enlarged perspective views, according to various embodiments of the present invention.

Figure 7:
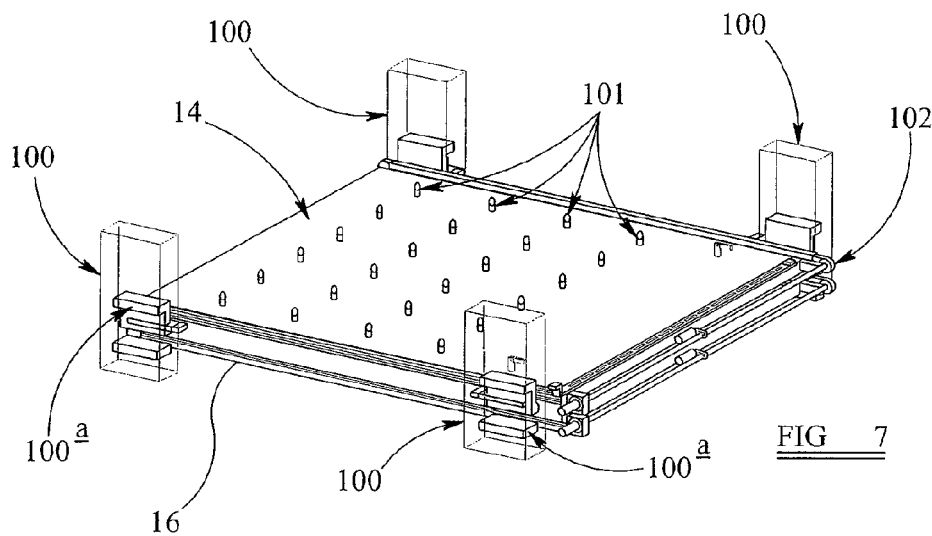
Figure 8:
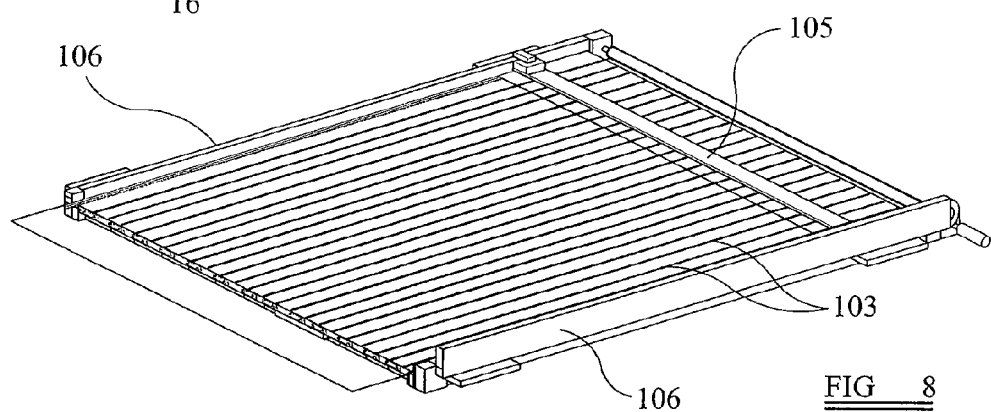
Figure 8A:
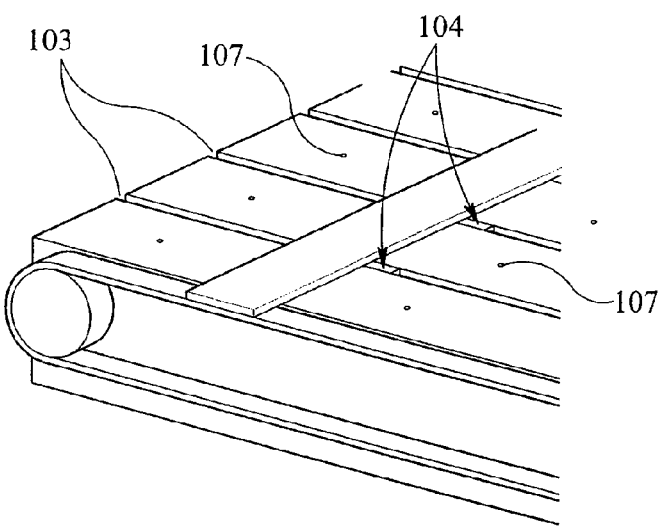
Figure 9E:
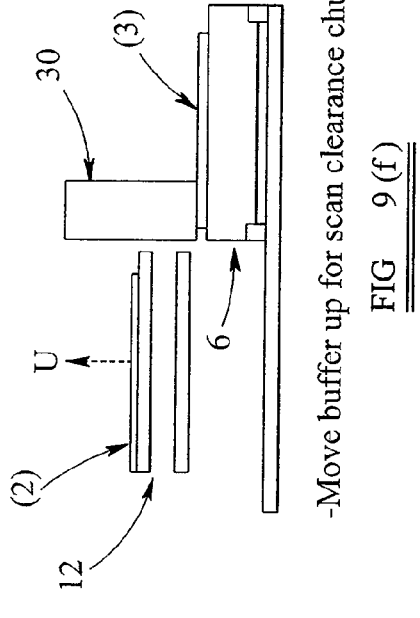
Figure 9F:
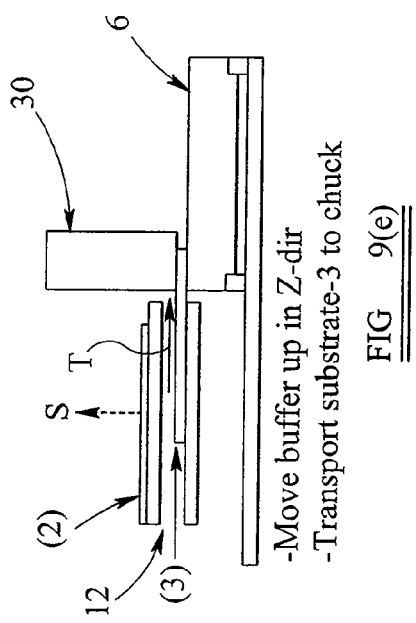
Figure 9G:
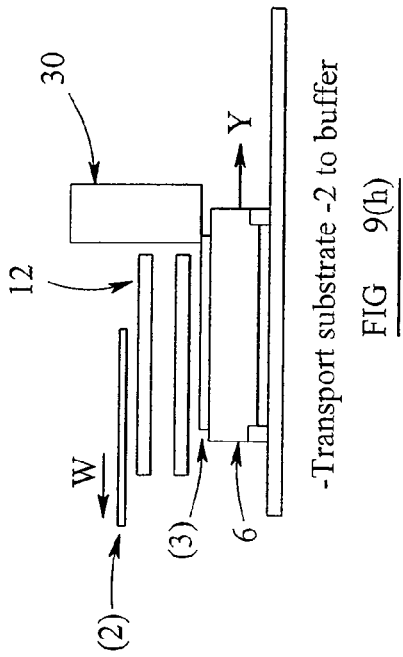
Figure 9H:
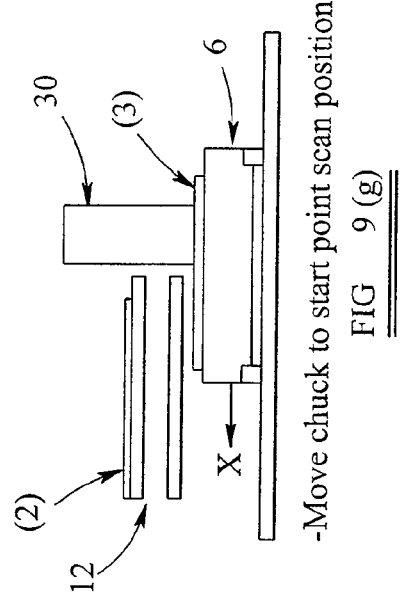

FIGS. 7, 8, and 8a show various perspective views of a substrate handler, according to various embodiments of the present invention.

FIGS. 9a-h and 10a-h show a schematic side view representation of a "Front in, Front out" loading sequence, according to various embodiments of the present invention.

FIGS. 11, 12a-h, 13a, and 13b show various side view representations of "Front in, Rear out" loading concepts, according to various embodiments of the present invention.

Figure 14A:
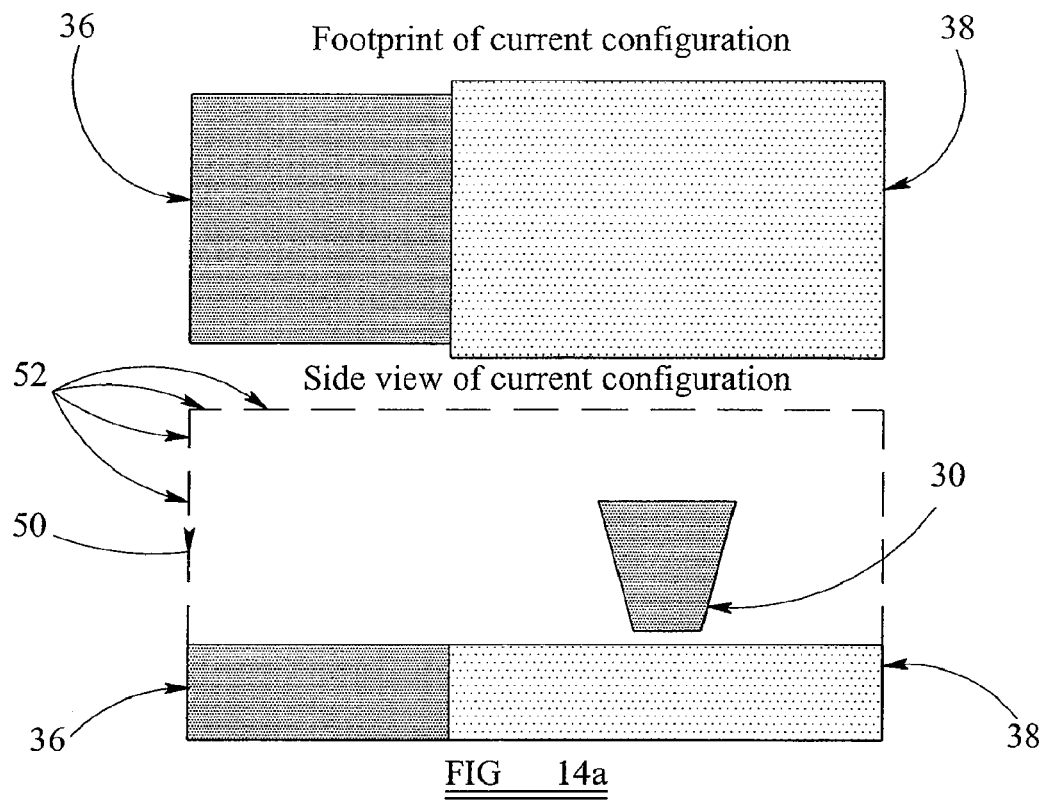
Figure 14B:
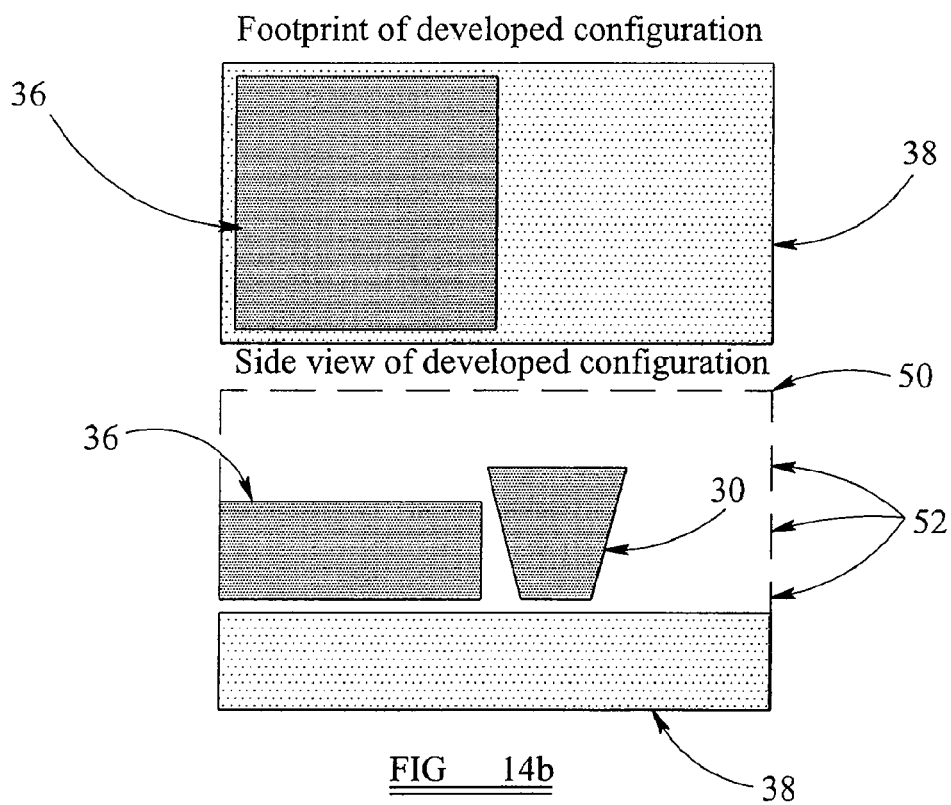
Figure 14C:
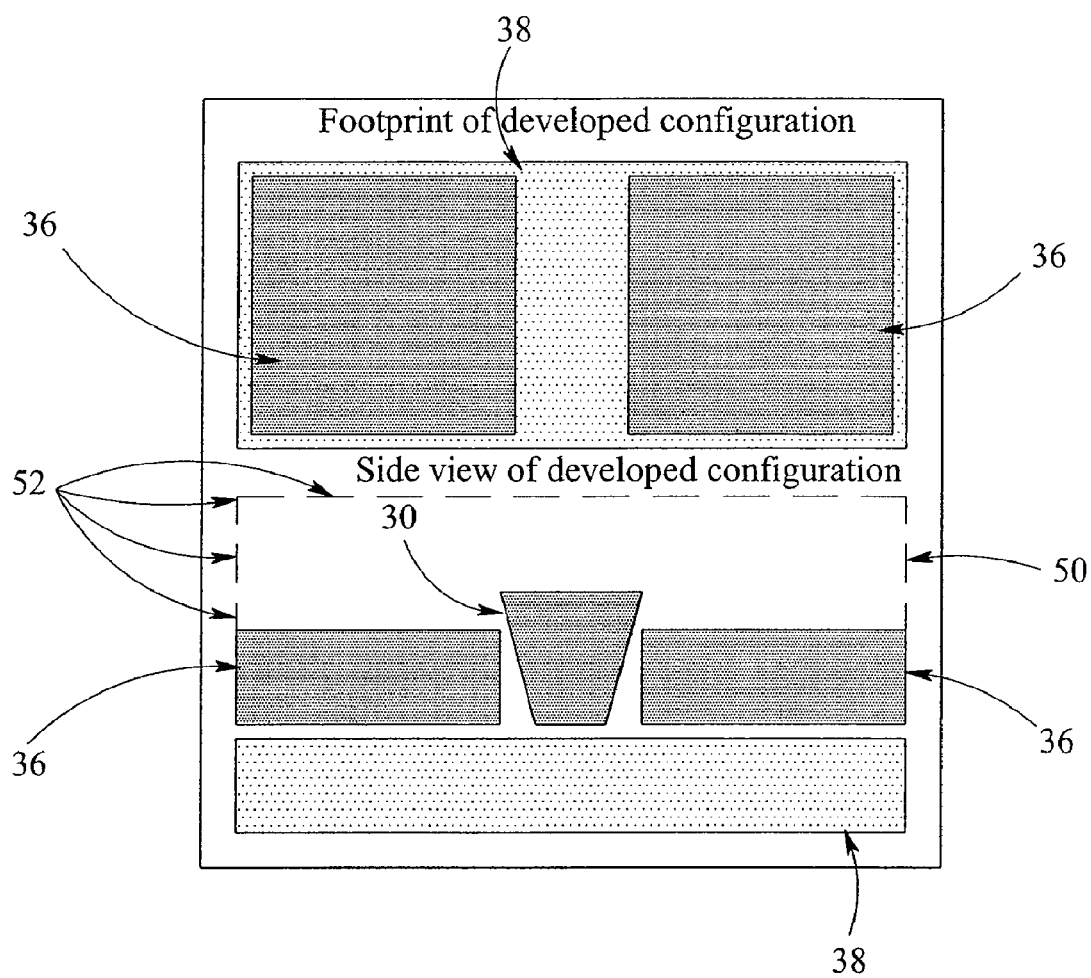

FIGS. 14a, 14b, and 14c show schematic plan and side views showing a footprint between first and second lithographic apparatus, according to one embodiment of the present invention.

Figure 15A:
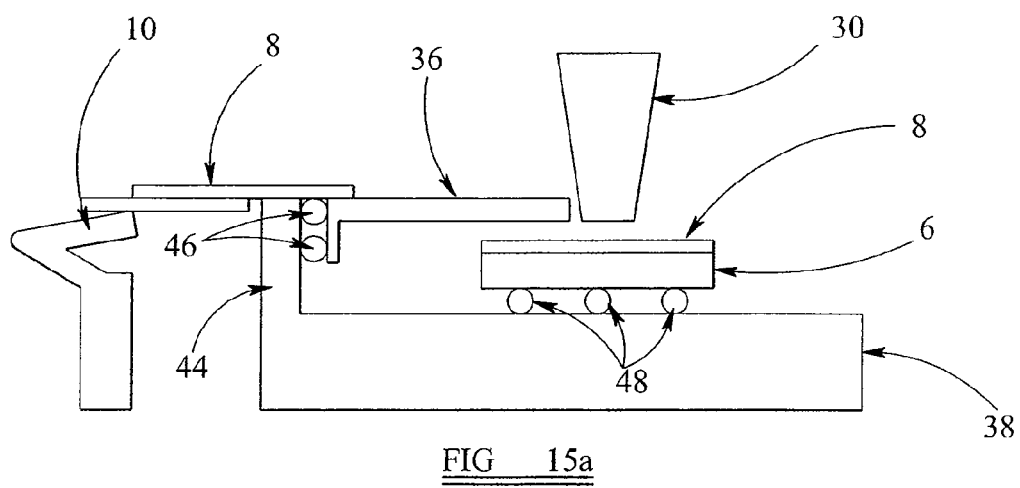
Figure 15B:
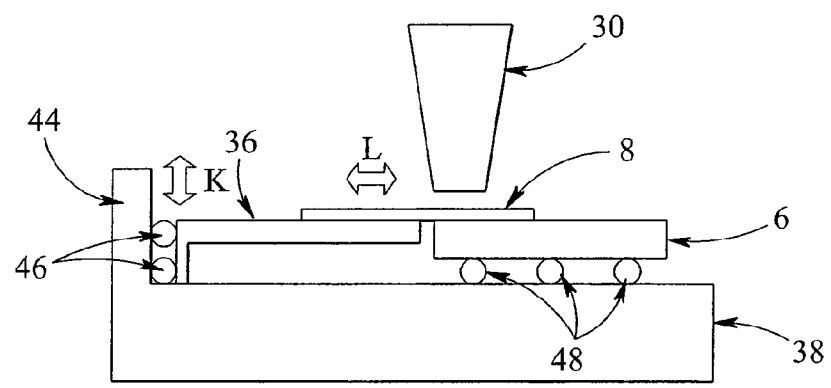

FIGS. 15a and 15b show schematic side views of one embodiment of the present invention during substrate exposure.

FIGS. 16a, 16b, 17a, 17b, 17c, and 17d show schematic side views of various embodiments of the present invention during pre-conditioning and substrate exchange.

Figure 18A:
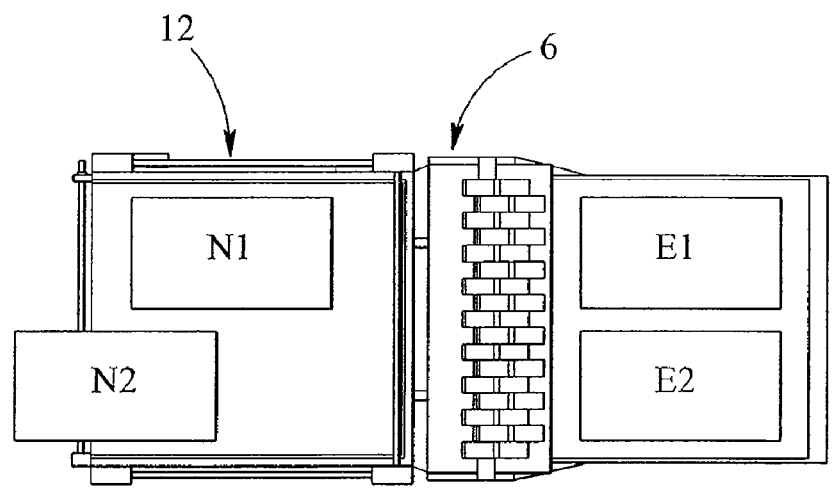
Figure 18B:
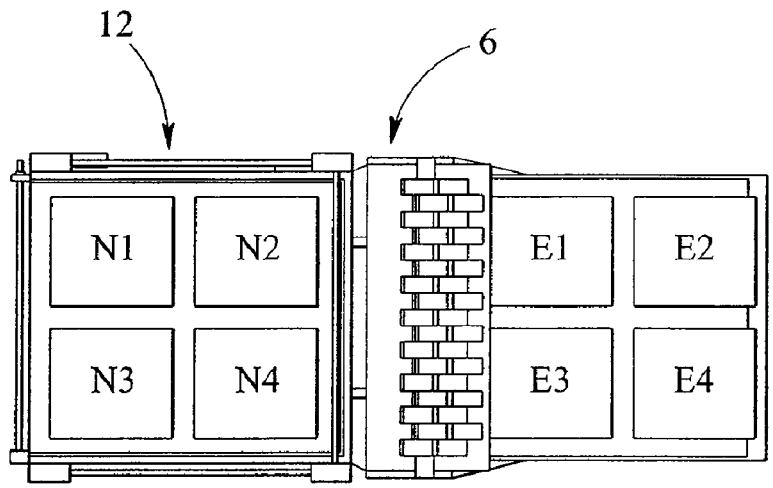
Figure 18C:
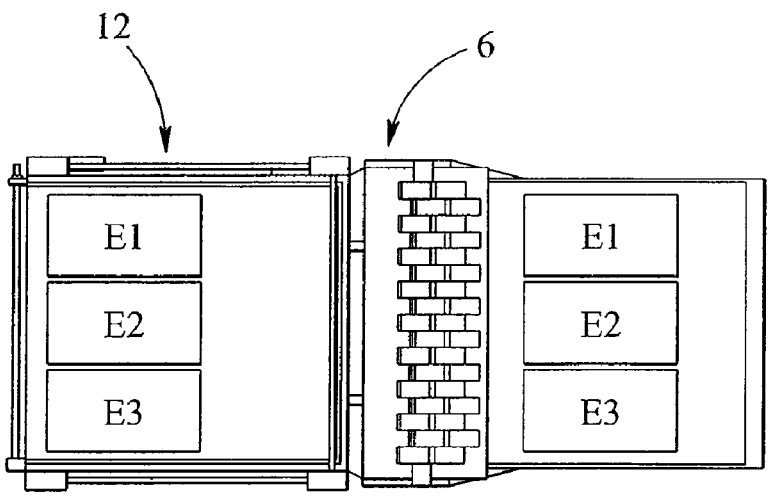

FIGS. 18a, 18b, and 18c are diagrammatic plan views of several alternative embodiments of the lithographic apparatus of the present invention.

Figure 19:
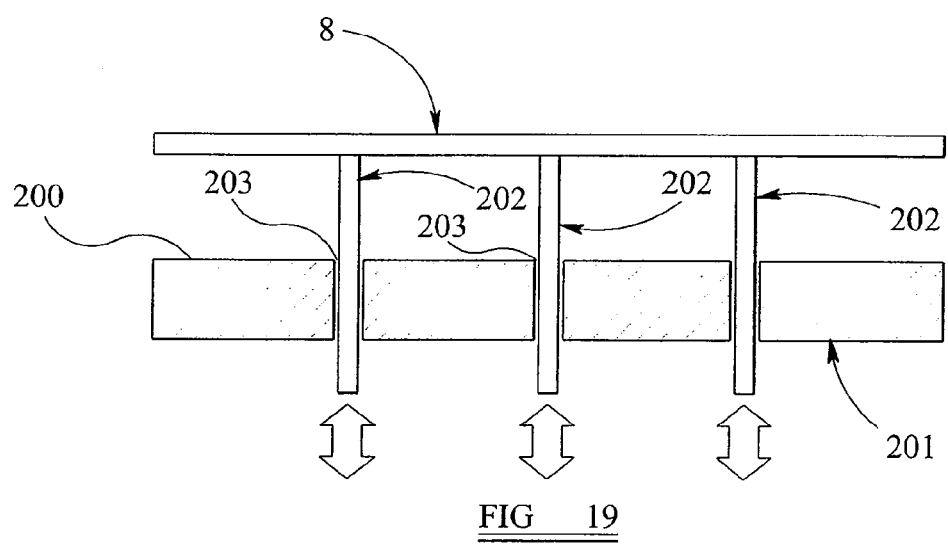

FIG. 19 is an alternative embodiment of a substrate handler in accordance with the present invention.

DETAILED DESCRIPTION

Overview and Terminology

The term "patterning system" used herein should be broadly interpreted as including any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning system can also be an imprint template, or other suitable mean of applying a pattern to a substrate.

The patterning device can be transmissive or reflective. Examples of patterning devices include masks, or an array of individually controllable elements. Masks are well known in lithography, and include mask types such as binary, alternating phase-shift, and attenuated phase-shift, as well as various hybrid mask types.

The term "array of individually controllable elements" as here employed should be broadly interpreted as referring to any means that can be used to endow an incoming radiation beam with a patterned cross-section, so that a desired pattern can be created in a target portion of the substrate. The terms "light valve" and "Spatial Light Modulator" (SLM) can also be used in this context.

Examples of such patterning means include the following.

A programmable mirror array. This can comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface. It will be appreciated that, as an alternative, the filter can filter out the diffracted light, leaving the undiffracted light to reach the substrate. An array of diffractive optical MEMS devices can also be used in a corresponding manner. Each diffractive optical MEMS device comprises a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the array of individually controllable elements can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference.

A programmable LCD array. An example of such a construction is given in U.S. Pat. No. 5,229,872, which is incorporated herein by reference.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein can be considered as synonymous with the more general terms "substrate" or "target portion", respectively.

The substrate referred to herein can be processed or preconditioned, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein can be considered as synonymous with the more general term "projection system".

The illumination system can also encompass various types of optical components, including refractive, reflective, and catadioptric optical components for directing, shaping, or controlling the projection beam of radiation, and such components can also be referred to below, collectively or singularly, as a "lens".

The lithographic apparatus can also be of a type wherein the substrate is immersed in a liquid having a relatively high refractive index, e.g., water, so as to fill a space between the final element of the projection system and the substrate. Immersion liquids can also be applied to other spaces in the lithographic apparatus, for example, between the mask and the first element of the projection system. Immersion techniques are well known in the art for increasing the numerical aperture of projection systems.

Exemplary Systems and Methods

Figure 1:
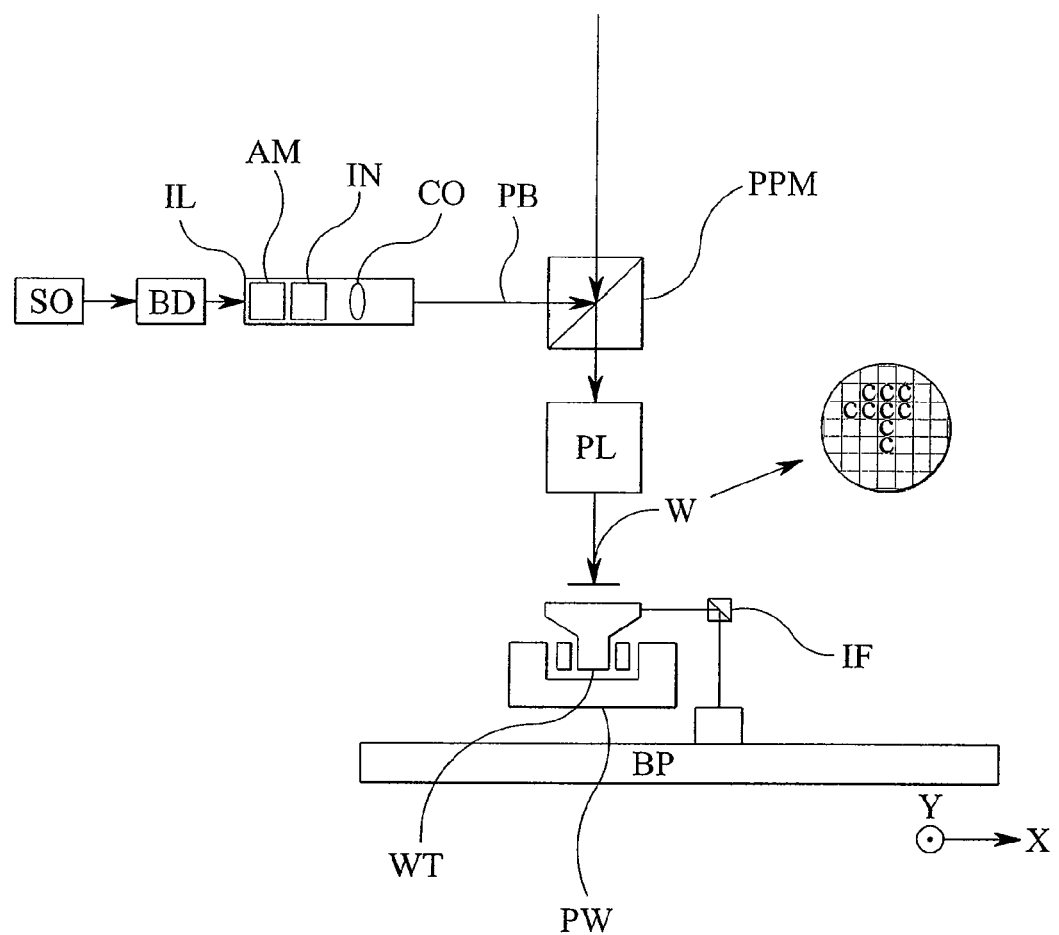
FIG. 1 shows a schematic side view of a lithographic apparatus, according to one embodiment of the present invention.

FIG. 1 schematically depicts a lithographic projection apparatus according to a particular embodiment of the present invention. The apparatus comprises an illumination system, an array of individually controllable elements PPM, a substrate table (e.g., a wafer table) WT, and a projection system ("lens") PL.

The illumination system (illuminator) IL provides a projection beam PB of radiation (e.g., UV radiation).

The array of individually controllable elements PPM (e.g., a programmable mirror array) applies a pattern to the projection beam. In general, the position of the array of individually controllable elements will be fixed relative to item PL. However, it can instead be connected to a positioning means for accurately positioning it with respect to item PL.

The substrate table (e.g., a wafer table) WT supports a substrate (e.g., a resist-coated wafer) W, and is connected to positioning means PW for accurately positioning the substrate with respect to item PL. The table WT is moveable on a base plate BP.

The projection system ("lens") PL images a pattern imparted to the projection beam PB by the array of individually controllable elements PPM onto a target portion C (e.g., comprising one or more dies) of the substrate W. The projection system can image the array of individually controllable elements onto the substrate. Alternatively, the projection system can image secondary sources for which the elements of the array of individually controllable elements act as shutters; the projection system can also comprise a micro lens array (known as an MLA), e.g., to form the secondary sources and to image microspots onto the substrate.

As here depicted, the apparatus is of a reflective type (i.e., has a reflective array of individually controllable elements). However, in general, it can also be of a transmissive type, for example (i.e., with a transmissive array of individually controllable elements).

The illuminator IL receives a beam of radiation from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source can be integral part of the apparatus, for example when the source is a mercury lamp. The source SO and the illuminator IL, together with the beam delivery system BD if required, can be referred to as a radiation system.

The illuminator IL can comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB subsequently intercepts the array of individually controllable elements PPM. Having been reflected by the array of individually controllable elements PPM, the projection beam PB passes through the projection system PL, which focuses the projection beam PB onto a target portion C of the substrate W. With the aid of the positioning means PW (and interferometric measuring means IF), the substrate table WT can be moved accurately, e.g., so as to position different target portions C in the path of the projection beam PB. Where used, the positioning means for the array of individually controllable elements can be used to accurately correct the position of the array of individually controllable elements PPM with respect to the path of the projection beam PB, e.g., during a scan. In general, movement of the object table WT is realized with the aid of a long-stroke module (coarse positioning) and a short-stroke module (fine positioning), which are not explicitly depicted in FIG. 1. A similar system can also be used to position the array of individually controllable elements. It will be appreciated that the projection beam can alternatively/additionally be moveable while the object table and/or the array of individually controllable elements can have a fixed position to provide the required relative movement. As a further alternative, that can be especially applicable in the manufacture of flat panel displays, the position of the substrate table and the projection system can be fixed and the substrate can be arranged to be moved relative to the substrate table. For example, the substrate table can be provided with a system for scanning the substrate across it at a substantially constant velocity.

Although the lithography apparatus according to the present invention is herein described as being for exposing a resist on a substrate, it will be appreciated that the present invention is not limited to this use and the apparatus can be used to project a patterned projection beam for use in resistless lithography.

The depicted apparatus can be used in various modes:

1. Step mode: the array of individually controllable elements imparts an entire pattern to the projection beam, which is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. Scan mode: the array of individually controllable elements is movable in a given direction (the so-called "scan direction", e.g., the Y direction) with a speed v, so that the projection beam PB is caused to scan over the array of individually controllable elements; concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

3. Pulse mode: the array of individually controllable elements is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

4. Continuous scan mode: essentially the same as pulse mode except that a substantially constant radiation source is used and the pattern on the array of individually controllable elements is updated as the projection beam scans across the substrate and exposes it.

Combinations and/or variations on the above described modes of use or entirely different modes of use can also be employed.

Although the lithographic apparatus illustrated in FIG. 1 is an optical apparatus, it will be appreciated that other non-optical patterning system can also be used to apply a pattern to a substrate. For example, an imprint lithography template can be used to imprint a pattern onto a substrate. Thus, the term lithographic apparatus is not intended to be limited to an optical lithographic apparatus.

Referring to FIG. 2, there is shown one embodiment of the present invention. In particular, FIG. 2 shows parts of the apparatus 2 that are involved with moving and manipulating substrates 8 (referred to as W in FIG. 1) to and from a substrate exposure table 6 (referred to as WT in FIG. 1), on which the substrates 8 are supported during exposure by the illumination source PL. Adjacent the substrate table 6, there is provided a substrate handler 12 for carrying substrates 8 to and from the exposure table 6. The substrate handler 12 has an upper stage 14 and a lower stage 16, both of which are suitably sized to accommodate a substrate 8. The substrate handler 12 is referred to as a double substrate handler 12 as it is able to support two substrates 8. The substrate handler 12 is arranged to move upwardly and downwardly as indicated by arrow A-A in FIG. 1, so that either the upper or lower stages 14,16 can be aligned in a horizontal plane with the substrate table 6.

The apparatus 2 includes a robot 10 for loading unexposed substrates 8 on to the substrate handler 12, and also for unloading exposed substrates 8 from the substrate handler 12 after exposure on the substrate table 6. Both the upper and lower stages 14,16 of the substrate handler 12 are provided with a series of rollers 20, which facilitate loading and unloading of a substrate 8 therefrom. In the apparatus shown in FIG. 2, the upper and lower stages 14,16 are fitted with four spaced apart rollers 20, each powered by a motor, although it is to be understood that other arrangements can be used such as, for example, a conveyor belt, an air cushion or film on which the substrate can "float," at least one linear actuator or a gripper mechanism for gripping a side edge of the substrate. The air cushion or film can be formed by providing the stages 14, 16 with a plurality of apertures (not shown) arranged to output a gas. The air cushion or film can be combined with a substrate table that has a surface of spaced raised regions such as pimples or the like. This is known in the art as a burl table.

The substrate handler 12 is either positioned above, or is integrated with, a pre-conditioning unit 18. The pre-conditioning unit 18 is used to bring the temperature of the substrates 8 in the lower stage 16 after they have been coated with resists to the appropriate level prior to its exposure on the substrate table 6. This is important so that the geometry of the substrate can be carefully controlled during the printing process. The pre-conditioning unit 18 comprises, for example, an aluminum conduction plate 19, which has a series of internal channels. Water, which can be maintained at a temperature of about 23° C., flows along the channels and cools/heats the substrate 8 with which it is in thermal contact. The cooled/heated (pre-conditioned) substrate 8 can then be moved on to the table 6 for exposure. As an alternative to maintaining the water at a constant temperature it can instead be controllably variable so as to control the temperature of the substrate.

In order to bring the substrate close to the pre-conditioning unit 18, the stages 14 and 16 are collapsible so as to reduce the vertical spacing between them and the pre-conditioning unit 18. The surface of the pre-conditioning unit has a plurality of spaced grooves 22 that are designed to receive the rollers 20 of the lower stage 16 when the substrate handler is in a collapsed configuration.

Although the figures show the pre-conditioning unit 18 adjacent to the lower stage 16 it is to be appreciated that it could equally be disposed adjacent to the upper stage 14 so as to pre-condition an unexposed substrate disposed thereon.

Referring to FIG. 3, there is shown the sequence of loading/unloading substrates 8 to and from the substrate exposure table 6 via the double substrate handler 12, according to one embodiment of the present invention. In FIG. 3, an exposed substrate 8 is represented as 8a, and an unexposed substrate is represented as 8b. At stage (a), a first unexposed substrate 8b is shown in position on the robot 10, having been picked up from a storage area (not shown) of unexposed substrates 8b. A second unexposed substrate 8b is shown on the lower stage 16 of the substrate handler 12, and an exposed substrate 8a is shown on the substrate exposure table 6. The upper stage 14 of the substrate handler 12, which is currently empty, is positioned so that it is horizontally aligned with the exposure table 6.

At stage (b), following exposure, the exposed substrate 8a is moved off the table 6 and on to the upper stage 14 of the substrate handler 12, in a direction as indicated by arrow B. Rollers 20 on the upper stage 14 facilitate transfer of the substrate 8a on to the substrate handler 12.

At stage (c), the substrate handler 12 is moved upwardly in a direction indicated by arrow C, so that the lower stage 16, and hence, unexposed substrate 8b thereon, is in horizontal alignment with the exposure table 6.

At stage (d), the unexposed substrate 8b is moved in a direction indicated by arrow D off the lower stage 16 and on to the exposure table 6. Rollers 20 on the lower stage facilitate transfer of the substrate 8b off the substrate handler 12.

At stage (e), the substrate handler 12 is moved downwardly in a direction as indicated by arrow E, so that the lower stage 16 is in horizontal alignment with the robot 10.

At stage (f), the unexposed substrate 8b on the robot 10 is moved in a direction as indicated by arrow F on to the lower stage 16 of the substrate handler 12.

At stage (g) of the sequence, the robot 10 is moved upwardly so that it is in horizontal alignment with the upper stage 14 of the substrate handler 12. The exposed substrate 8a can then be moved off the substrate handler 12 in a direction indicated by arrow G on to the robot 10. The robot 10 then moves the exposed substrate 8a away from the substrate handler 12 to a storage area (not shown). The sequence is then repeated.

In one example, the substrate handler 12 could be fixed in a vertical position, and it is the substrate table 6 that is moved vertically and relative thereto.

Referring to FIG. 4, there is shown a double substrate handler 24, according to an alternative embodiment of the present invention. In this embodiment, the double substrate handler 24 is integrated with the robot 10. The double substrate handler 24 is attached to the top of the robot 10 and comprises upper and lowers stages 14,16 as previously described. The Figure shows a substrate 8 on both the stages 14,16 of the double substrate handler 24. In addition, the double substrate handler 24 includes a pre-conditioning unit 18 attached to one side of the lower stage 16 for pre-conditioning unexposed substrates 8b prior to exposure on the substrate table 6. Again, it is to be appreciated that the pre-conditioning unit 18 can alternatively be associated with the upper stage 14 if unexposed substrates are loaded thereon.

Referring to FIG. 5, there is shown a double substrate handler 26, according to a further embodiment of the present invention. The double substrate handler 26 has an upper and lower stage 14,16, each having two spaced apart elongate slots 25 extending along a plane thereof. The two slots 25 in the upper stage 14 extend at 90° with respect to the two slots 25 in the lower stage 16. Each of the slots 25 is designed to receive, in sliding engagement, an elongate rod 27 of a transport device. The rods 27 are thus received in the stages 14 or 16 under the substrates and can be used to lift them free of the stage surface and to transport them to the exposure table. Similarly such rods 27 can be used to transport unexposed substrates from a conveyor belt or track on to the handler 26.

Both stages 14,16 of the double substrate handler 26 include partially sunken rollers 20, which are provided to facilitate the movement of substrates 8 on and off the double substrate handler 26. In addition, a pre-conditioning unit 18 is integrated in to the lower stage 16 of the double substrate handler 26. The handler is moveable upwardly and downwardly in directions indicated by arrow H so that it can be aligned with the substrate exposure table 6.

Referring to FIG. 6, there is shown a substrate handler 28, according to further embodiment of the present invention. The substrate handler 8 is moveable upwardly and downwardly in directions indicated by arrow J relative to the substrate exposure table 6. The substrate handler 28 has an upper stage 14, and lower stage 16 with an integrated pre-conditioning unit 18. The substrate handler 28 is shown located adjacent the exposure table 6, and a robot 10 is shown transferring a substrate 8 on to the substrate handler 28.

FIG. 7 shows a substrate handler, according to one embodiment of the present invention. The substrate handler has an upper stage 14 and lower stage 16 as before, but the upper stage 14 is used to receive unexposed substrates from the robot and load them on to the exposure table 6, whereas the lower stage 14 is designed to unload exposed substrates from the exposure table 6 to the robot. The stages 14, 16 are supported at each corner by guide columns 100 that serve guide the vertical movement of the stages. Each column 100 receives a corresponding projection 100a defined on the edge of each stage and which is slidably disposed within the column. It is to be appreciated that in some cases less than four such guide columns can be used. A drive mechanism 102 which can be contained, at least in part, in the guide columns serves to move each stage to the desired vertical position. The mechanism can be constructed so that the movement of the two stages is mechanically coupled so that they move in unison. The drive mechanism can have different transmission ratios between the two stages so that the distance between the stages will vary with their vertical position relative to the columns.

Each of the stages 14, 16 of the substrate handler of FIG. 7 has a plurality of upstanding pins 101 spaced over its surface. These pins 101 are designed to support the substrate above the upper surface of a panel defining the stage, so as to provide a clearance between the upper surface of the stage panel and the substrate so as to improve access for a robot end effector. The plane occupied by the tips of the pins, in effect, becomes the operational surface of the stage. The pins 101 are pivotally connected to the stage so that they can move between the upright position and a stored position, where they are no longer upright. This movement of the pins is used to move the supported substrate laterally during its delivery to or from the exposure table. The pins 101 can be provided with bores and connected to a supply of negative pressure so that a partial vacuum is applied to help retain the substrate on the stage during transportation. In an alternative arrangement, the pins 101 can be moveable in a linear direction along the direction of movement of the substrate (i.e., perpendicular to the axes of the pins). This movement of the pins is used to move the supported substrate laterally during its delivery to or removal from the exposure table.

In various examples, the stages 14, 16 have a plurality of nozzles (not shown) distributed over the support surface or platform for directing a jet of gas such as air towards the substrate. The nozzles are connected to a source of such gas and are designed to create a film or cushion of gas between the upper surface of the stage 14, 16 and the substrate, the film or cushion serving to prevent contact of the substrate with the stage surface. Such nozzles can be provided with or without the pins 101 described above and can include the facility to control the direction of the gas flow so that the substrate can be urged in a predetermined direction during loading or unloading.

In FIGS. 8 and 8A there is shown a single stage of an alternative substrate handler, according to one embodiment of the present invention. The surface of the stage has a plurality of grooves 103 parallel to the direction of transportation of the substrate. These grooves 103 serve as guides for fingers 104 (see FIG. 8a) that hold the substrate during transportation thereof. The fingers are connected to a transportation bar 105 that extends across the stage surface in a direction perpendicular to the direction of movement. The transportation bar is driven by a drive member (e.g., a motor) via a transmission element (e.g., a cable, chain or a belt drive) disposed in a housing 106 on each side of the stage. The surface of the stage has a plurality of nozzles 107 that direct a jet of gas, for example air, towards the substrate as described above.

The various embodiments of the substrate handlers described herein can be optionally fitted with a preconditioning unit that is designed to bring the substrate to the appropriate temperature for exposure. This can be achieved by controlling the temperature of the substrate support stage by any suitable form of heat-exchanging apparatus. One proposed embodiment is to provide one or more internal or external channels in the stage and supplying them with temperature controlled water or other fluid. The substrate can be directly in contact with the surface of the stage or can be supported on an operational surface provided by an air film or cushion as described above. In the latter case the air between the support stage and the substrate serves as the heat conductive layer as well as a means for transporting the substrate to or from the exposure stage. The thickness of the air film or cushion when transporting the substrate is typically in the region of 300 µm and can be reduced to less than 100 µm when serving to thermally condition the substrate.

Referring to FIG. 9, there is shown a "Front in, Front out" loading/unloading sequence of substrates 8, according to one embodiment of the present invention. The loading is to and from the substrate exposure table 6, so-called because a substrate 8 is loaded and unloaded from the front of the exposure table 6 (i.e., on the left hand side of a scanner 30 in FIG. 9). This is carried out using the double substrate handler 12. In the Figure, substrates (1), (2) and (3) are shown at various positions on the apparatus. At stage (a), the substrate table 6 is shown in a starting position supporting an unexposed substrate (2) underneath a scanner 30. The table 6 moves in a direction indicated by arrow L along a base plate BP and underneath the scanner 30, thereby irradiating the substrate (2). Previously exposed substrate (1), is now unloaded by a robot (not shown) from the upper stage 14 of the double handler 12, in a direction indicated as arrow K, i.e., opposite to the direction of movement of the table 6.

At stage (b), the table continues to move in a direction shown as arrow P, such that substrate (2) continues to be scanned. The substrate handler 12 is moved upwardly in a direction as shown by arrow N, and unexposed substrate (3) is loaded by a robot (not shown) on to the lower stage 16 of the substrate handler 12. At stage (c), the table 6 is shown in its most extreme position at one end of base plate BP, such that the entire surface of the substrate (2) has been completely scanned. This makes sufficient room for the substrate handler 12 to be lowered down in a direction as indicated by arrow Q to the scanning level. At stage (d), substrate (2) is removed off the table 6 in a direction shown by arrow R on to the upper stage 14 of the substrate handler 12.

At stage (e), the substrate handler 12 is moved upwardly in a direction shown by arrow S so that the lower stage 16 is in horizontal alignment with the table 6. Substrate (3) is then moved off the substrate handler 12 and on to the table 6 in a direction shown by arrow T. At stage (f), the substrate handler 12 is raised further in a direction shown by arrow U allowing sufficient clearance from the table 6 such that the table 6 can be moved back in a direction of arrow X until it has returned to its 'start' position, as shown at stage (g). At stage (h), the exposure table 6 is shown moving in a direction shown by arrow Y, such that substrate (3) undergoes the scanning process as described above. Substrate (2) is removed from the substrate handler 12 in a direction shown by arrow W, and the entire sequence is then repeated.

FIG. 10 shows a sequence for loading and unloading substrates 8 to and from the substrate exposure table 6 using a double substrate handler 12 in which the preconditioning unit is associated with the upper stage 14, according to one embodiment of the present invention.

Figure 11:
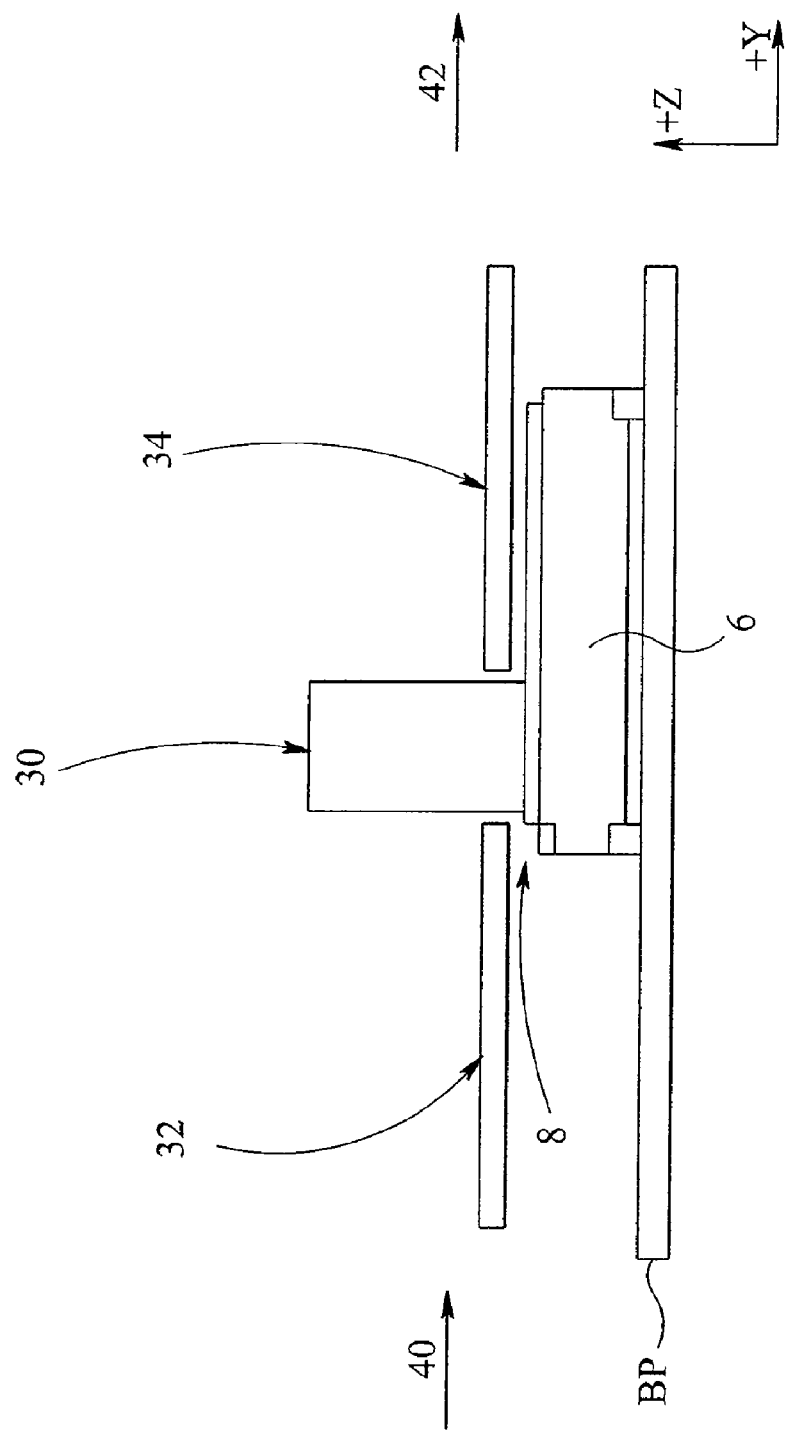
Figure 12A:
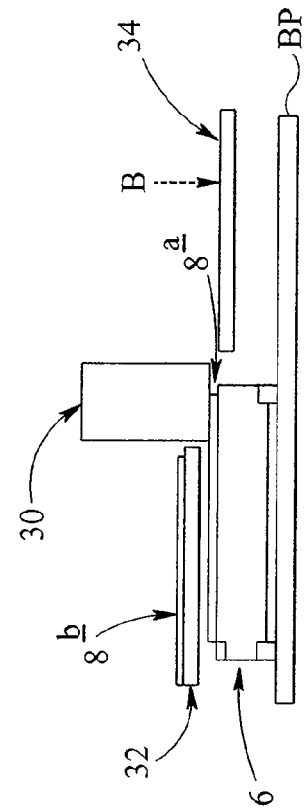
Figure 12B:
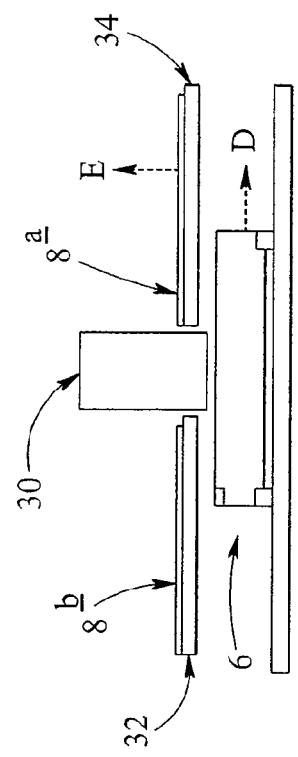
Figure 12C:
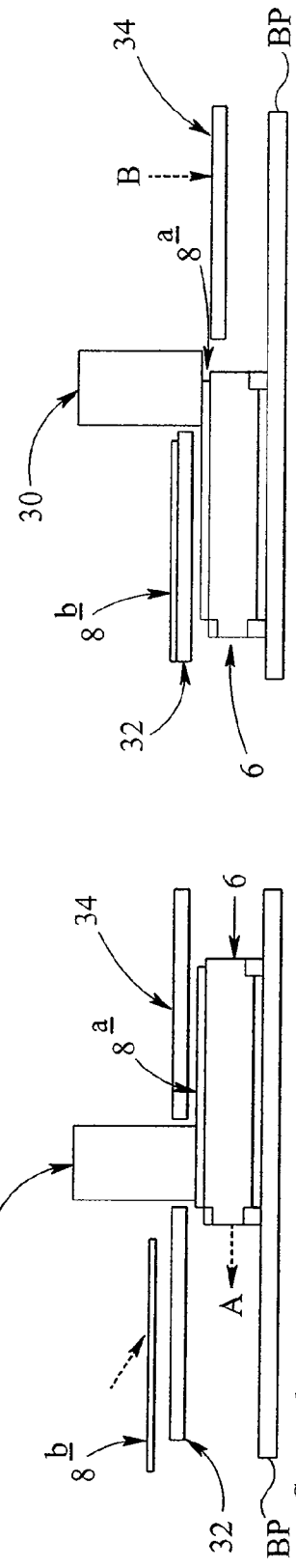
Figure 12D:
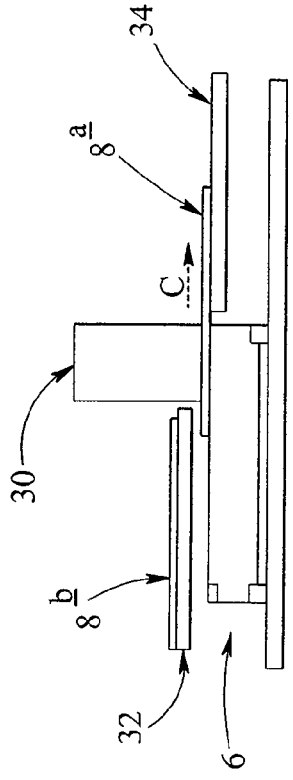

Referring to FIGS. 11 and 12, there is shown a "Front in, Rear out" sequence of loading/unloading substrates 8 to and from the substrate exposure table 6 using a substrate handler 12, according to various embodiments of the present invention. One of the stages of the substrate handler 12 has been moved from the front side of the table 6 to the rear side.

FIG. 11 illustrates the concept of "Front in, Rear out" loading/unloading sequence, so-called because a substrate 8 is loaded on to the front of the exposure table 6 (i.e., on the left hand side of the scanner 30 in FIG. 8), and unloaded from the rear of the exposure table 6 (i.e., on the right hand side of the scanner in FIG. 8). The apparatus includes an exposure table 6 on which substrates are supported during the scanning procedure by the optic scanner 30. On the loading side 40 of the scanner 30, there is provided a pre-conditioner/load plate 32. On the opposite unloading side 42 of the scanner 30, there is provided an unload plate 34.

Referring to FIG. 12, at stage (a), a substrate 8a is shown supported on the exposure table 6, which is in its 'start' position. As table 6 moves in a direction indicated by arrow A relative to the scanner 30, substrate 8a is scanned. A new unexposed substrate 8b is then lowered into position on the pre-conditioner/load plate 32 by a robot (not shown). At stage (b), once the table has reached its 'end' position at one extremity of a base plate BP, scanning of the substrate 8a has been completed. The unload plate 34 is then moved downwardly in a direction shown by arrow B until it is in horizontal alignment with the table 6. At stage (c), the scanned substrate 8a is then moved in a direction shown by arrow C on to the unload plate 34. At stage (d), the unload plate 34 is moved upwardly to allow sufficient clearance for the table 6 to pass thereunder as it moves in a direction shown by arrow D back to its 'start' position.

At stage (e), the pre-conditioner/load plate 32 loaded with the unscanned substrate 8b is lowered until it is in horizontal alignment with the table 6. In addition, the scanned substrate 8a is removed off the unload plate 34 by a robot (not shown). At stage (f), substrate 8b is moved across in a direction shown by arrow G off the load plate 32 and on to the exposure table 6. At stage (g), the table 6 is moved away from the scanner 30 in a direction indicated by arrow I. The pre-conditioner load plate 32 is raised in a direction shown by arrow H to provide clearance for the table 6 to return in a direction shown by arrow J, thereby scanning the substrate 8b. The entire sequence is then repeated.

The apparatus having the double substrate handler 12 allows for an increased product throughput due to the decreased substrate 8 swapping time and resultant decreased down-time. The handler that is capable of handling two substrates at the same time can swap substrates 8 without "put away and pick up" movements seen in conventional handlers. In addition, the substrate handler 12 can be integrated with a pre-conditioning unit 18 on the same floor space further increasing throughput. Furthermore, the pre-conditioning unit 18 can be situated near the substrate exposure table 6. Hence, no time is lost for the necessary pre-conditioning of substrates 8.

In the embodiments of FIGS. 11 and 12, the unloader 34 is disposed within the footprint of the scanning table 6, such that when the table is at the right hand extent of its travel (see FIG. 12g) the unloader 6 is positioned directly above the table 6.

Figure 13A:
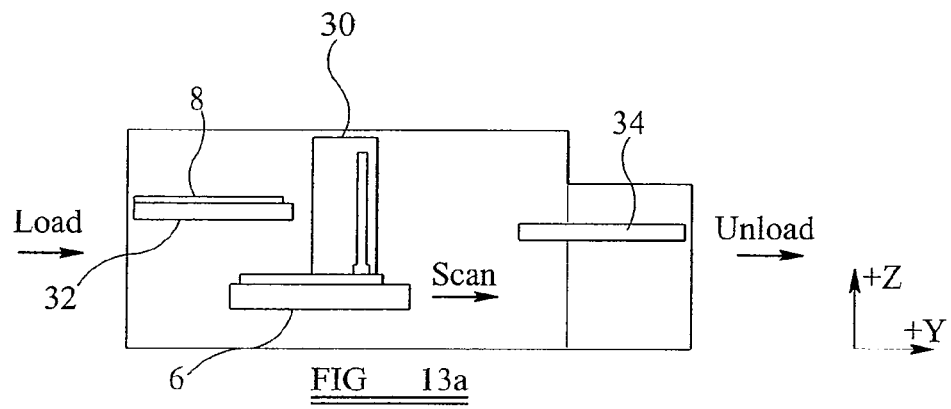
Figure 13B:
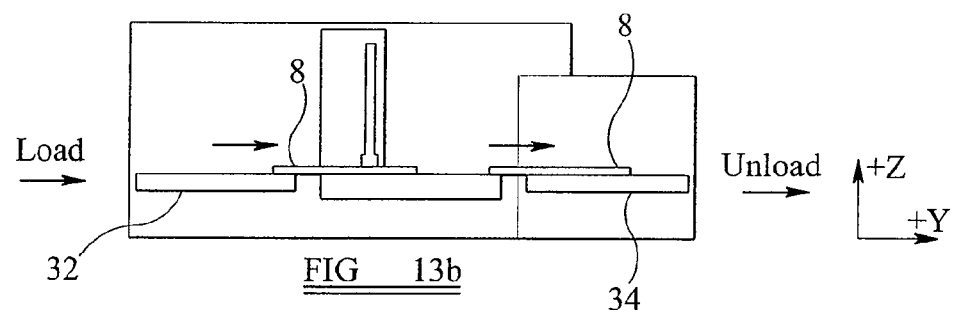

FIGS. 13a and 13b show another embodiment of the present invention, in which the unloader 34 can be disposed beyond footprint of the scanning table. In this embodiment, the unloader 34 is disposed further to the right of the table 6 than in the previous embodiment. When a substrate 8 is being exposed the both parts 32, 34 of the handler are raised vertically above the level of the table, as shown in FIG. 13a. The handler is lowered to perform the loading and unloading operations and the arrangement is such that when the exposure table 6 is at the limit of its travel to the right (see FIG. 13b) the unloader 34 is still clear of its footprint and so the exposed substrate can be unloaded directly as shown. The exposure table 6 travels over a base member that can be in the form of a plate and which is not shown in FIG. 13. As can be seen from FIG. 13b the arrangement allows simultaneous loading and unloading of the substrates 8. Thus, although this configuration increases the overall footprint of the apparatus, it does provide for an improve throughput as the transport time to and from the table is reduced.

Referring to FIGS. 14a, b, and c, there are shown comparative plan and side views of a conventional lithographic apparatus (FIG. 14a), and two embodiments of the apparatus according to the present invention (FIGS. 14b and 14c). FIGS. 14a-14c show the apparatus consisting of a handling stage 36, an exposure tool 38, and an optic scanner 30 (visible in the side view). These parts of the apparatus are contained with a frame 50 structure made up of a series of cover plates 52.

In the conventional apparatus shown in FIG. 14a, the handling stage is located adjacent to the exposure tool 38. In addition, the pre-conditioning stage for the substrate 8 is also situated next to the exposure table 6. Because a pre-conditioning stage is at least the same size as the substrate 8, this is a significant amount of the apparatus 'footprint,' i.e., the total surface area of the apparatus.

In the embodiment shown in FIG. 14b, showing the apparatus using the "Front in, Front out" loading/unloading system, for example as illustrated in FIG. 7, the handling stage 36 is positioned above and to one side of the exposure tool 38. In the embodiment showing in FIG. 14c, the apparatus uses the "Front in, Rear out" loading/unloading system, for example as illustrated in FIGS. 8 and 9, in which the apparatus has two handling stages 36, one either side of the scanner 30, all of which are located above the exposure tool. Hence, it will be appreciated that the 'footprint' of the two embodiments of the apparatus according to the present invention (i.e., FIGS. 14b & 14c), is much less than that of the conventional apparatus, because the handling stage(s) 36 is positioned above the exposure tool 38 as opposed to being positioned adjacent the exposure tool 38. This is a footprint reduction of approximately 30%.

Referring to FIGS. 15a and 15b, there is shown the configuration of the apparatus during exposure of a substrate 8 (FIG. 15a), and during substrate exchange via a handling stage (FIG. 15b), according to one embodiment of the present invention. The apparatus has a side wall 44 from which the handling stage 36 is supported via rollers 46. The rollers 46 allow vertical movement along the side wall 44. It will be appreciated that the handling stage 36 is positioned above the exposure tool 38 at all times thereby reducing the footprint of the apparatus. During substrate 8 exposure, the table 6 is moved horizontally from side to side underneath the exposure scanner 30. The table 6 is also provided with rollers 48 to allow movement along the exposure tool 38. The robot 10, which is located outside of the apparatus footprint, is shown transferring a substrate 8 on to the handling stage 36.

As shown in FIG. 15b, during substrate 8 exchange, the handling stage 36 is lowered in a direction indicated by arrow K, until it is in horizontal alignment with the exposure table 6, and hence, substrate 8 which has just been exposed. The substrate 8 is then moved in a direction illustrated by arrow L between the handling stage 36 and the exposure table 6.

Referring to FIG. 16a, there is shown a similar apparatus to that shown in FIG. 15, except that a double handling pre-conditioning stage is used, i.e., a double substrate handler 12, for example as discussed with reference to FIG. 9. The substrate handler 12 can hold a substrate 8 on the upper and also lower stages 14,16. The substrate handler 12 can move vertically up and down the side wall 44 by means of the rollers 46. In addition, the exposure table 6 moves left and right underneath the scanner 30. It will be appreciated that the substrate handler 12 is usually above the exposure tool 38, thereby reducing the footprint of the apparatus.

Referring to FIG. 16b, there is shown substrate 8 exchange, for example using the apparatus discussed with reference to FIGS. 11 and 12. The apparatus has two handling stages 32,34, one on either side of the scanner 30. Each stage 32, 34 is able to move up and down their respective side wall 44 along rollers 46. The apparatus has two robots 10, one which loads substrates 8 on to the loading stage 32 on the front side, and one which unloads substrates 8 from the unload stage 34 on the rear side.

In one example, the significantly smaller apparatus footprint (30% reduction), and integrated pre-conditioning unit 18. There is a resultant lower machine cost because of the smaller machine footprint and volume. Also, the total weight of the machine is less due to the smaller footprint. Also, the apparatus is compatible with the double substrate loading configuration with the double handler 12.

Referring to FIGS. 17a, 17b, 17c, and 17d, there is shown an alternative embodiment of a double handler/pre-conditioner 54. In this embodiment, the upper stage 14 and the lower stage 16 are pivotable with respect to each other such that the distance therebetween can be varied, i.e., increased or decreased. Hence, if a substrate 8 is being loaded or unloaded from the handler 54, the distance between the upper and lower stages 14,16 of the handler can be increased so that access thereto, for example, by a robot 10, is easier. If the handler 54 is being moved within the apparatus, for example, vertically upwardly or downwardly with respect to the scanner 30, then the distance between the upper and lower stages 14,16 of the handler 54 can be decreased to minimize the volume it occupies and to bring a pre-conditioning unit (not shown in this embodiment) closer to the appropriate stage and substrate.

Figure 17A:
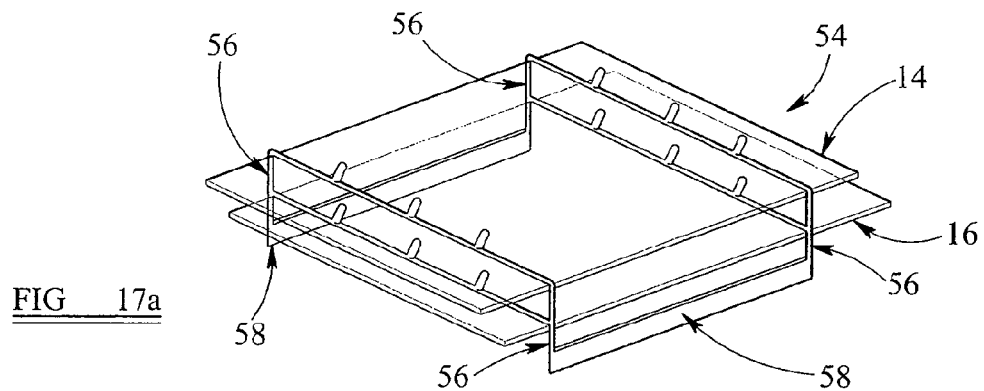
Figure 17B:
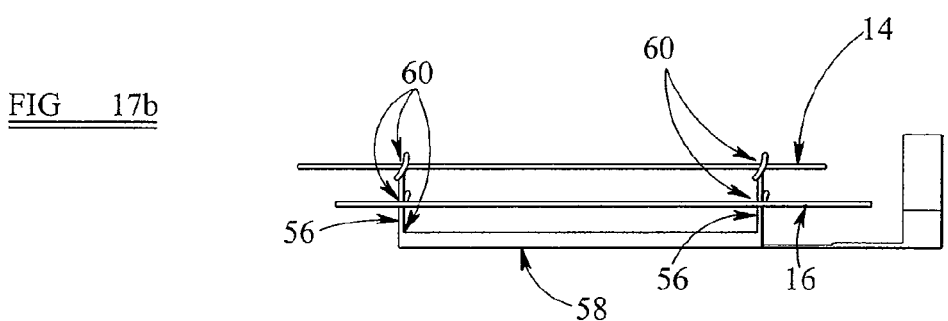
Figure 17C:
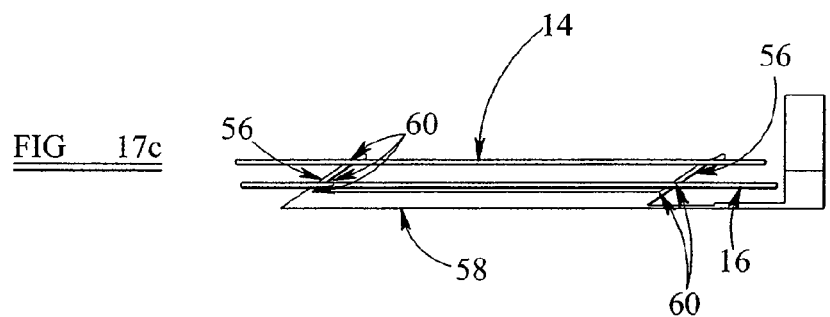

The handler 54 comprises a collapsible frame with two mutually opposing elongate base portions 58. A short spacer portion in the form of a leg 56 is pivotally attached to each end of the two base portions 58 by a hinge 60 and extends perpendicularly away therefrom. The upper stage 14 of the handler 54 is pivotally attached by a hinge 60 to an end of each of the four legs 56 distal from the base portion 58. The lower stage 16 is pivotally attached by a hinge 60 to midway along each of the four legs 56. Hence, the upper and lower stages 14,16 are able to pivot about hinges 60 on the spacer portions 56, thereby moving from a fully open configuration as illustrated in FIGS. 17a and 17b, to a partially open configuration shown in FIG. 17c, to a closed or locked position shown in FIG. 17d. Collapsing of the stages 14,16 by pivoting the legs 56 can be effected by any kind of suitable actuator such as, for example, one or more hydraulic or pneumatic rams that are operable under the control of a computer.

In an alternative arrangement, legs 56 can be configured to be axially extendable and retractable (this may be achieved, for example, hydraulically or pneumatically), rather than pivotable.

Figure 17D:
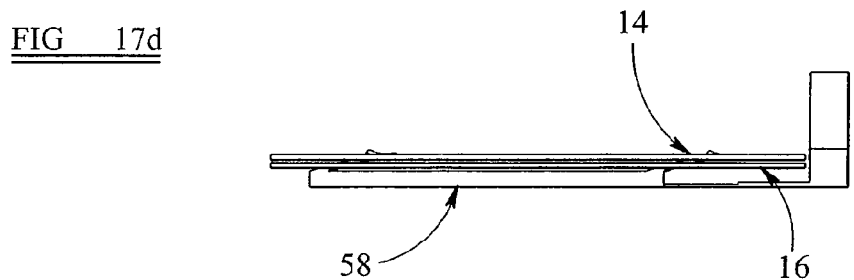

In one example, the manner in which the pivotable handler 54 is able to open and close, thereby facilitating access to the substrates 8 when the handler 54 is in the open configuration as illustrated in FIG. 17b, and 'lock' substrates in the lower stage 16 when in the closed configuration as illustrated in FIG. 17d.

FIGS. 18a, 18b, and 18c show three different versions of substrate handlers that are configured to support more than one substrate at a time, according to various embodiments of the present invention. In FIG. 18a there is shown a substrate handler 12 adjacent to an exposure table 6. A robot (not shown) is used to load the handler with two adjacent unexposed substrates N1, N2. These two substrates N1 and N2 can then be loaded simultaneously on to the substrate table 6 to the positions indicated by reference numbers E1 and E2. FIG. 18b illustrates one embodiment in which four substrates N1-N4 arranged into a 2 by 2 matrix can be loaded simultaneously to positions E1 to E4 and FIG. 18c shows a version whereby three substrates N1 to N3 arranged in parallel are loaded simultaneously. The same arrangement can be used to unload multiple exposed substrates simultaneously. It will be appreciated that the substrate handlers can have the same design as any of those described above.

FIG. 19 illustrates an alternative embodiment of the substrate handler, according to one embodiment of the present invention. The substrate 8 is supported above the surface 200 of the platform 201 by means of pins 202 that are vertically movable (in the direction of the arrows) in holes 203 in the platform 201 by any suitable actuator. Although not shown in this figure the tops of the pins can be fitted with rollers of the kind shown in FIG. 2 or 5. It is to be understood that the platform could also be the preconditioning unit referred to above.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A substrate handler, comprising:
a support surface configured to carry a substrate; and
a pre-conditioning unit comprising a device, the device being configured to control a temperature of a substrate and comprising a heat-exchanging element configured to transfer heat away from or to the substrate;
wherein the pre-conditioning unit is configured to pre-condition the substrate before exposure by a projection system; and
wherein the substrate handler is configured to move the substrate relative to a substrate table.

2. The substrate handler of claim 1, wherein:
the heat-exchanging element comprises a heat exchanging plate arranged to be in thermal contact with the substrate during pre-conditioning; and
the heat exchanging plate comprises at least one channel extending therealong, which heat exchanging plate is configured to heat or cool the substrate by thermal conduction.

3. The substrate handler of claim 2, wherein:
the pre-conditioning unit comprises fluid arranged to flow along the at least one channel, whereby heat is conducted to or away from the substrate; and
the substrate handler is configured to maintain the fluid at a substantially constant temperature.

4. The substrate handler of claim 2, wherein:
the pre-conditioning unit is configured to generate an air film between the plate and the substrate during pre-conditioning; and
the air film serves to transfer heat to or from the substrate.

5. The substrate handler of claim 1, wherein the pre-conditioning unit is one of integrated with or disposed substantially adjacent the substrate handler.

* * * * *